(12) United States Patent
Umetsu et al.

(10) Patent No.: US 6,563,079 B1
(45) Date of Patent: May 13, 2003

(54) METHOD FOR MACHINING WORK BY LASER BEAM

(75) Inventors: Kazushige Umetsu, Chino (JP); Jun Amako, Shiojiri (JP); Shinichi Yotsuya, Chino (JP); Katsuji Arakawa, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/673,874
(22) PCT Filed: Feb. 25, 2000
(86) PCT No.: PCT/JP00/01085
§ 371 (c)(1), (2), (4) Date: Oct. 23, 2000
(87) PCT Pub. No.: WO00/50198
PCT Pub. Date: Aug. 31, 2000

(30) Foreign Application Priority Data

Feb. 25, 1999 (JP) ............................................. 11-047433
Feb. 25, 1999 (JP) ............................................. 11-047434

(51) Int. Cl.⁷ .............................................. B23K 26/00
(52) U.S. Cl. .............................. 219/121.71; 219/121.69
(58) Field of Search .................... 219/121.71, 121.6, 219/121.67, 121.68, 121.69, 121.7, 121.76, 121.84; 257/774, 507, 521, 681, 777, 524

(56) References Cited

U.S. PATENT DOCUMENTS

| | | | |
|---|---|---|---|
| 4,722,914 A | * | 2/1988 | Drye et al. |
| 5,629,244 A | * | 5/1997 | Matsuzaki |
| 6,294,745 B1 | * | 9/2001 | Gruber |
| 6,424,048 B1 | | 7/2002 | Umetsu et al. |

FOREIGN PATENT DOCUMENTS

| | | |
|---|---|---|
| JP | A-63-207151 | 8/1988 |
| JP | A-2-297445 | 12/1990 |
| JP | A-3-233177 | 10/1991 |
| JP | A-3-253025 | 11/1991 |
| JP | A-6-326314 | 11/1994 |
| JP | A-9-29467 | 2/1997 |
| JP | A-10-34365 | 2/1998 |
| JP | A-10-202878 | 8/1998 |
| JP | A-11-1000 | 1/1999 |

OTHER PUBLICATIONS

Fuji et al., *Fabrication Of Microdiaphragm Pressure Sensor Utilizing Micromachining,* Sensors and Actuators A: Physical, vol. 34, pp. 217–224 (1992).

Ishii et al., *CO2 Laser Beam Machining Techniques,* Nikkan Koglyo Shinbun Sha, pp. 63–68, Dec. 21, 1992.

* cited by examiner

Primary Examiner—M. Alexandra Elve
Assistant Examiner—Jonathan Johnson
(74) Attorney, Agent, or Firm—Oliff & Berridge, PLC

(57) ABSTRACT

A method for processing a work in which a processed hole with a high aspect ratio is formed by laser machining. Silicon oxide films (2) are formed as protective films on front and rear surfaces, respectively, of a silicon substrate (1). The silicon substrate (1) is irradiated with a laser light through the protective films (2) to thereby perform a perforating process. Alternatively, the silicon substrate (1) is irradiated with a circularly or randomly polarized laser light. Hence, a processed hole with a high aspect ratio can be obtained. Moreover, the processed hole can be shaped straightly, so that processing accuracy is improved.

17 Claims, 39 Drawing Sheets

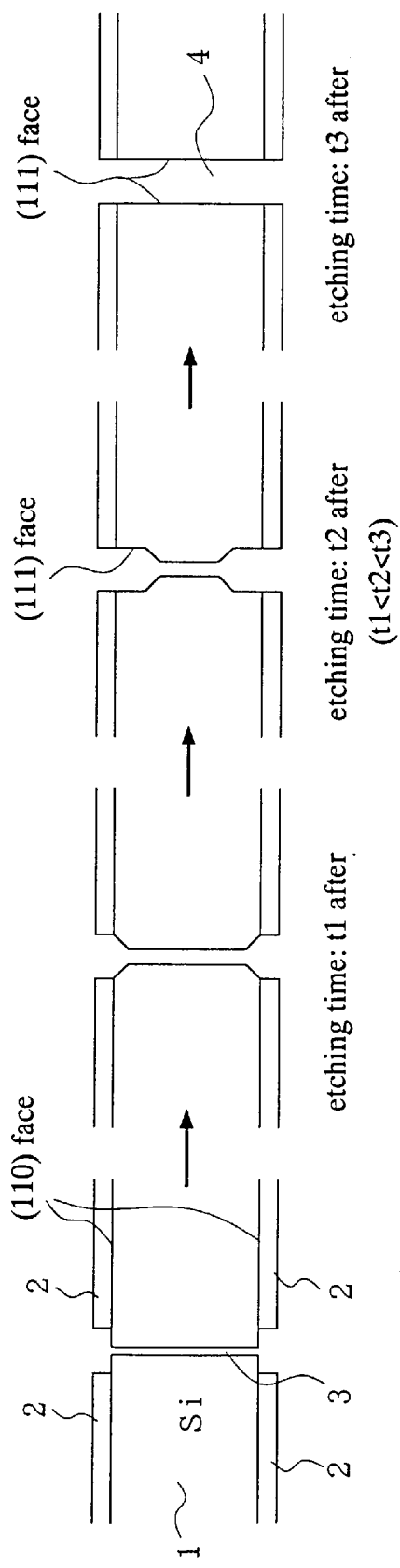
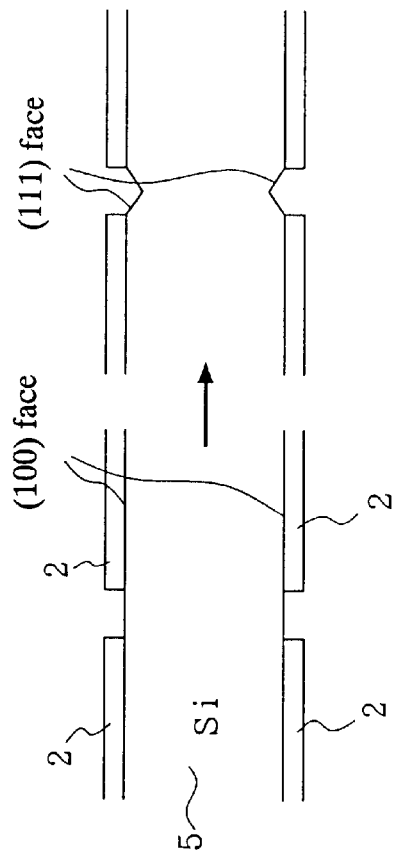
FIG. 1A
FIG. 1B

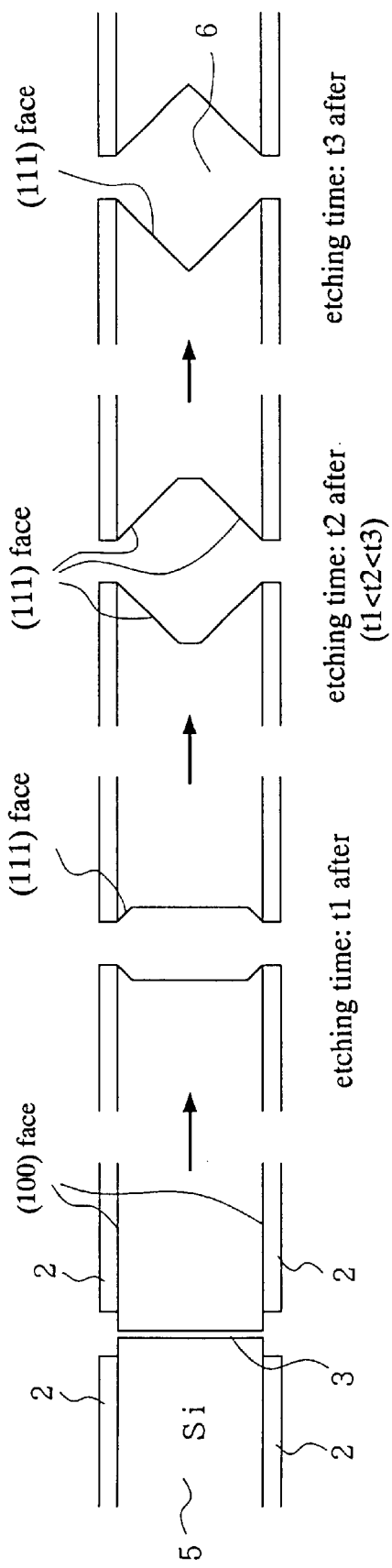
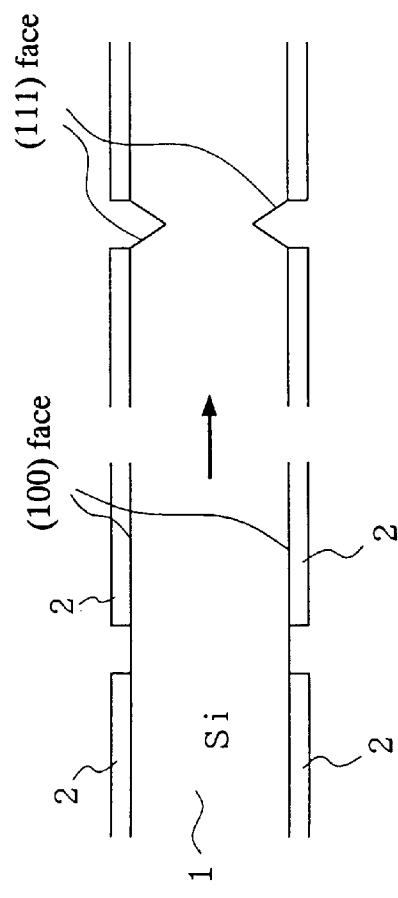
FIG. 2A
FIG. 2B circular polarization random polarization

Direction of Radiation of S-polarized light (when light turns to right)

Direction of Radiation of S-polarized light (when light turns to left)

Relationship between Polarization and Laser Beam Absorption Factor in Si

A - A section

B - B section

A - A section

B - B section

C - C section

A - A section

B - B section

C - C section

Before Ultrasonic Cleaning

Before Ultrasonic Cleaning

FIG. 38 A
FIG. 38 B
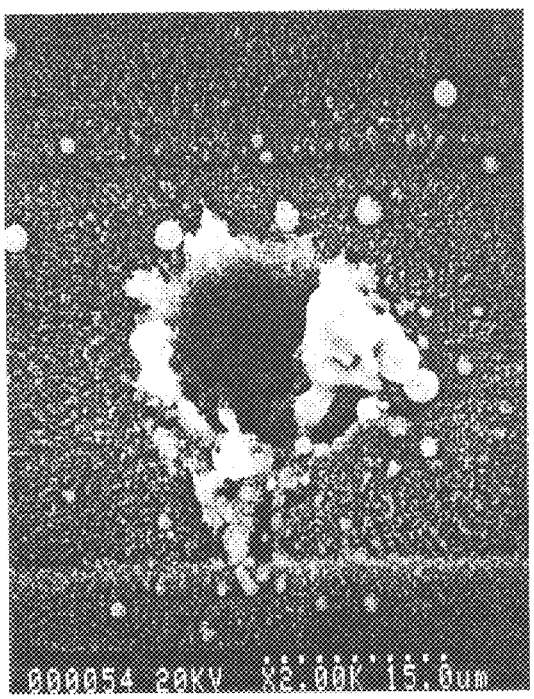
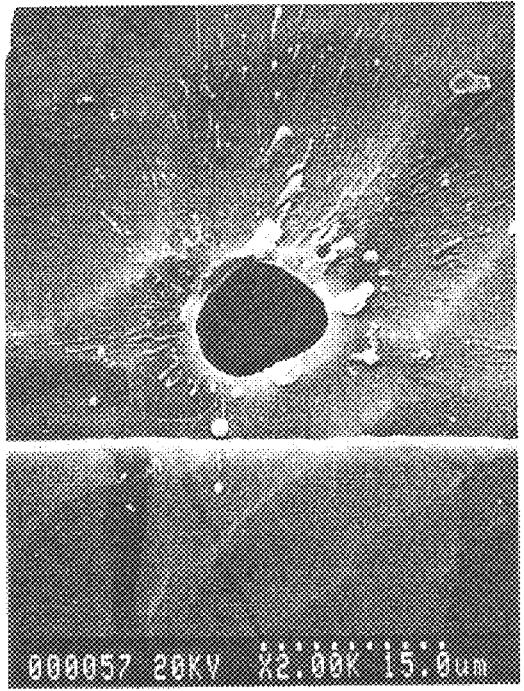
Laser incidence plane
Laser exit plane Section X 200

Before Etching (Exit plane)

×200

After Etching (Exit plane)

×200

Incidence Plane X 100

Section (Cut surface observation) X 100

Exit Plane X 100

Number of Shots: 50

Number of Shots: 500

Number of Shots: 5000

Number of Shots: 50

Number of Shots: 500

Number of Shots: 5000

Number of Shots: 50

Number of Shots: 500

Number of Shots: 5000

Number of Shots: 50

Number of Shots: 500

Number of Shots: 5000

Number of Shots: 50

Number of Shots: 500

Number of Shots: 5000

Number of Shots: 50

Number of Shots: 500

Number of Shots: 5000

FIG. 47 A
FIG. 47 B
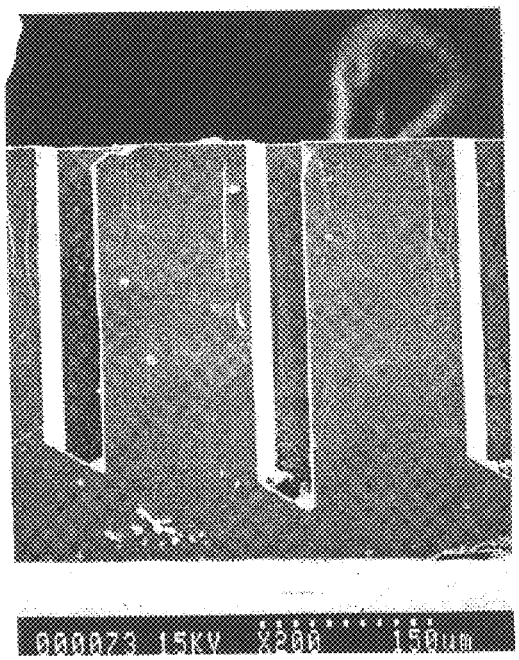
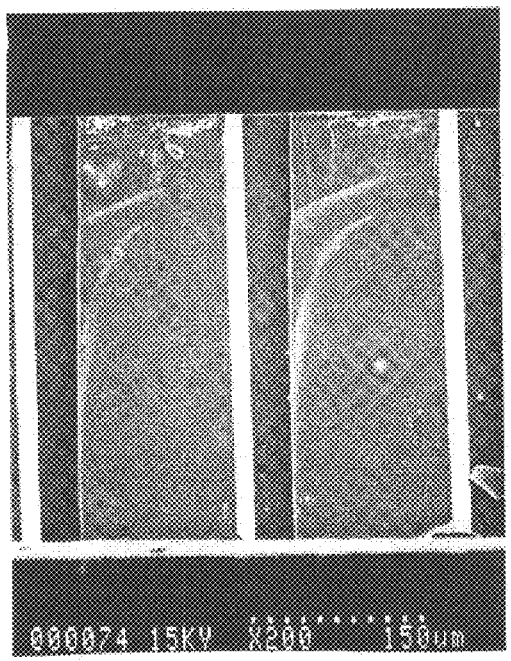
when laser light is not perfectly pierced the substrate
when laser light has pierced the substrate Before Ultrasonic Cleaning  X 500

After  Ultrasonic Cleaning  X 500

Laser incidence plane  X 500

Incidence Plane X 50

Section (Longitudinal direction) x 50

Section (Widthwise direction) x 50

Exit Plane X 50

Section (Longitudinal direction: SEM) X 50

METHOD FOR MACHINING WORK BY LASER BEAM

TECHNICAL FIELD

The present invention relates to a method for processing a work, by using laser, on a base such as a silicon substrate, and particularly relates to a perforating process for forming a hole such as a through-hole, or the like, or a grooving process.

BACKGROUND ART

A process such as a process of perforating a base such as a silicon substrate by laser light radiation has been performed heretofore. For example, a process of forming a through-hole by irradiation of a semiconductor wafer with a laser light has been performed. In the processing for formation of such a through-hole by laser light radiation, however, the quality of the processed hole was poor because distortion owing to heat generated at the time of laser machining remained in an inner wall surface of the processed hole or because a dissolved substance was deposited on the inner wall surface of the processed hole. Moreover, there was a problem that reliability was lowered because a scattered product (called "dross" or "debris") was generated at the time of laser machining and deposited on the periphery of the base.

Moreover, when the hole width was to be enlarged by using a laser light alone, it was necessary to increase laser power or elongate the processing time. In addition, there was another problem that processing accuracy was worsened because a through-hole was bent and distorted when the through-hole was formed by use of a laser light. Further, there was a further problem that, when the through-hole was to be formed by etching alone, a through-hole with a high aspect ratio could not be formed because of the crystal orientation of silicon.

DISCLOSURE OF THE INVENTION

A work of the present invention is to provide a method for processing a work in which a processed hole with a high aspect ratio can be formed by laser machining.

Another work of the present invention is to provide a method for processing a work in which heat distortion remaining inside a processed hole or a dissolved substance deposited on the processed hole can be removed by laser machining.

A further work of the present invention is to provide a method for processing a work in which the processed hole obtained by laser machining can be enlarged easily.

A further work of the present invention is to provide a method for processing a work in which dross produced at the time of laser machining can be removed easily.

A further work of the present invention is to provide a method for processing a work in which processing accuracy can be improved without occurrence of any situation in which the through-hole produced by laser machining is bent and distorted.

(1) According to an aspect of the present invention, there is provided a method for processing a work, comprising the steps of: forming a prehole by irradiation with a laser light; and performing anisotropic etching to thereby enlarge the prehole. Wet etching (anisotropic etching) which greatly varies in etching speed depending on the crystal orientation of silicon is preferably used as the anisotropic etching when a silicon substrate is used as the base. Hence, the following effects are obtained in the present invention.

① After a prehole is formed by laser light radiation, the prehole is enlarged by anisotropic etching. Hence, a hole or the like with a high aspect ratio can be obtained without any limitation that it is difficult to form a relatively narrow hole with respect to the thickness.

② Further, when such a hole is to be processed by laser machining alone, either the processing time must be elongated or laser power must be increased. However, because the prehole is enlarged by anisotropic etching, a batch process can be performed. Hence, the processing time can be shortened. Moreover, the variations in diameter among the processed hole shapes are small, so that the holes are formed uniformly.

③ Moreover, enlargement of the hole diameter (hole width) of the hole shapes can be adjusted at option by adjustment of the time required for anisotropic etching.

④ Moreover, dross and processing dust remaining on the inner wall which are produced by laser light radiation can be removed automatically when anisotropic etching is performed.

⑤ Roughness of the inner wall surface owing to laser machining is removed by anisotropic etching. When the base is made of silicon, a smooth crystal surface of silicon is exposed. Hence, when, for example, a through-hole is formed to be used as a fluid channel for a fluid, the inner wall surface of the through-hole presents no obstacle to the fluid. On the other hand, when a through-hole is formed in a semiconductor wafer in order to electrically connect front and rear surfaces of the semiconductor wafer to each other, various thin films such as an electrically insulating film, an electrically conducting film, etc. must be formed on the inner wall surface. In this case, because a smooth inner wall surface can be obtained as described above, each of the various thin films can be also formed uniformly and thinly.

⑥ Because a place needing to be subjected to etching can be exposed by laser light radiation, a process of forming an opening in a protective film by photolithography may be omitted. Hence, production cost can be reduced.

(2) According to another aspect of the present invention, in the method for machining a work to be machined as stated in the above paragraph (1), a protective film is formed on the base and the base is irradiated with a laser light through the protective film. Dross is produced when machining is performed by laser light radiation. The dross is deposited on the base and the protective film but it can be removed easily by etching at the time of enlargement of the processed hole. Hence, high reliability is obtained.

(3) According to another aspect of the present invention, in the method for machining a work to be machined as stated in the above paragraph (2), an opening portion is formed in the protective film and a portion of the opening portion where the base is exposed is irradiated with a laser light.

(4) According to another aspect of the present invention, in the method for machining a work to be machined as stated in the above paragraph (2) or (3), the base is irradiated with a circularly polarized laser light. Because the base is irradiated with such a circularly polarized laser light, the processed hole can be formed straightly. Hence, the width of the hole after etching can be reduced more, and processing accuracy is improved.

(5) According to another aspect of the present invention, in the method for machining a work to be machined as stated in the above paragraph (2) or (3), the base is irradiated with a randomly polarized laser light. Because the base is irradiated with such a randomly polarized laser light, the processed hole can be formed straightly. Hence, the width of the hole after etching can be reduced more, and processing accuracy is improved.

(6) According to another aspect of the present invention, in the method for machining a work to be machined as stated in any one of the above paragraphs (1) through (5), the laser light is scanned to thereby form continuous preholes. The work to be machined can be machined into the form of a groove by the aforementioned process.

(7) According to another aspect of the present invention, in the method for machining a work to be machined as stated in any one of the above paragraphs (1) through (6), the prehole is enlarged by the anisotropic etching to thereby form a through-hole. Hence, the following effects can be obtained in the present invention.

① After a prehole is formed by laser light radiation, the prehole is enlarged by anisotropic etching to thereby form a through-hole. Hence, a through-hole with a high aspect ratio can be obtained without any limitation that it is difficult to form a relatively narrow hole with respect to the thickness.

② Further, when such a through-hole is to be formed by laser machining alone, either the processing time must be elongated or laser power must be increased. However, because the prehole is enlarged by anisotropic etching to thereby form the through-hole, a batch process can be performed. Hence, the processing time can be shortened. Moreover, the variations in diameter among the through-holes are small, so that the through-holes are formed uniformly.

③ Moreover, enlargement of the hole diameter (hole width) of the through-hole can be adjusted at option by adjustment of the time required for anisotropic etching.

(8) According to another aspect of the present invention, in the method for machining a work to be machined as stated in any one of the above paragraphs (1) through (7), the base is a silicon substrate. Hence, a protective film can be formed easily on a surface of the base.

(9) According to another aspect of the present invention, in the method for machining a work to be machined as stated in the above paragraph (8), the silicon substrate has a surface of (110) face. When the base has such a surface, a perpendicular hole with a high aspect ratio can be obtained accurately by use of wet crystal anisotropic etching.

(10) According to another aspect of the present invention, in the method for machining a work to be machined as stated in the above paragraph (8), the silicon substrate has a surface of (100) face. When the base has such a surface, a hole with a high aspect ratio can be obtained accurately by use of wet crystal anisotropic etching.

(11) According to another aspect of the present invention, in the method for machining a work to be machined as stated in the above paragraph (10), the substrate is obliquely irradiated with a laser light. When, for example, a silicon substrate having (100) face is obliquely irradiated with a laser light, four inner wall surfaces serve as (111) faces, and a hole shaped straightly so as not to be widened inward can be obtained. Hence, the pitch between holes can be reduced more. Moreover, because the hole width can be formed to be equal to the size of an oxide film, the hole width need not be controlled by the etching time. Moreover, because the sectional shape of the hole can be defined on the basis of the faces of plane-orientation (111), there is no variation in shape among the holes.

(12) According to another aspect of the present invention, in the method for machining a work to be machined as stated in any one of the above paragraphs (2) through (11), protective films are formed on front and rear surfaces, respectively, of the base and the opposite surfaces of the base are irradiated with laser lights respectively. Hence, a prehole deeper (twice in the case of irradiation from a single surface) can be formed by the same power. Accordingly, a through-hole, or the like, with a high aspect ratio can be obtained.

(13) According to another aspect of the present invention, in the method for machining a work to be machined as stated in any one of the above paragraphs (1) through (12), a laser light is splited by a phase grating so that the base is irradiated with the splited laser lights. Because preholes can be formed at a plurality of places, the processing time can be shortened greatly.

(14) According to another aspect of the present invention, in the method for machining a work to be machined as stated in the above paragraph (13), a laser light is splited in one direction by the phase grating so that the substrate is irradiated with the splited laser lights.

(15) According to another aspect of the present invention, in the method for machining a work to be machined as stated in the above paragraph (13), a laser light is splited into two directions perpendicular to each other by the phase grating so that the base is irradiated with the splited laser lights. Because a laser light is splited into two directions (X and Y directions) so that the base is irradiated with the splited laser lights simultaneously, the processing time can be shortened more greatly.

(16) According to another aspect of the present invention, in the method for machining a work to be machined as stated in any one of the above paragraphs (2) through (15), a fluted protective film formed so as to cover a periphery of the hole is removed by ultrasonic cleaning. Hence, a dangerous process such as treatment with hydrofluoric acid can be omitted if an oxide film is permitted to remain on the surface.

(17) According to another aspect of the present invention, in the method for machining a work to be machined as stated in any one of the above paragraphs (2) through (15), a fluted protective film formed so as to cover a periphery of the hole is removed on the basis of adjustment of processing time required for anisotropic etching. Hence, a dangerous process such as treatment with hydrofluoric acid can be omitted if an oxide film is permitted to remain on the surface.

(18) According to another aspect of the present invention, in the method for machining a work to be machined as stated in any one of the above paragraphs (7) through (17), the through-hole is provided for forming electrode pads disposed on front and rear surfaces of a semiconductor chip. The through-hole for forming electrode pads can be processed with high reliability.

(19) According to another aspect of the present invention, in the method for machining a work to be machined as stated in any one of the above paragraphs (7) through (17), the through-hole is provided for forming an ink discharge hole of an ink jet head. The ink discharge hole can be processed with high reliability.

(20) According to another aspect of the present invention, in the method for machining a work to be machined as stated in the above paragraph (6) or any one of the above paragraphs (8) through (17), the continuous preholes are provided for forming an ink chamber of an ink jet head. The ink chamber can be formed with a high aspect ratio, so that an ink jet head of high performance can be obtained.

(21) According to another aspect of the present invention, in the method for machining a work to be machined as stated in any one of the above paragraphs (7) through (17), the through-hole is a through-hole of a suction valve of a micro-pump. The through-hole of the suction valve of the micro-pump can be processed with high reliability.

BRIEF DESCRIPTION OF THE DRAWINGS

FIGS. 1A and 1B are process charts showing a method (part 1) for machining a work to be machined according to Embodiment 1 of the present invention and an example for comparison with the method (part 1).

FIGS. 2A and 2B are process charts showing a method (part 2) for machining a work to be machined according to Embodiment 1 of the present invention and an example for comparison with the method (part 2).

FIGS. 47A and 47B are views of sections (observed cut surfaces) in the case where, after an oxide film is formed on a silicon substrate having a plane-orientation (110) face, the substrate is irradiated with a laser light and then etched.

BEST MODE FOR CARRYING OUT THE INVENTION

Embodiment 1

Figure 3:
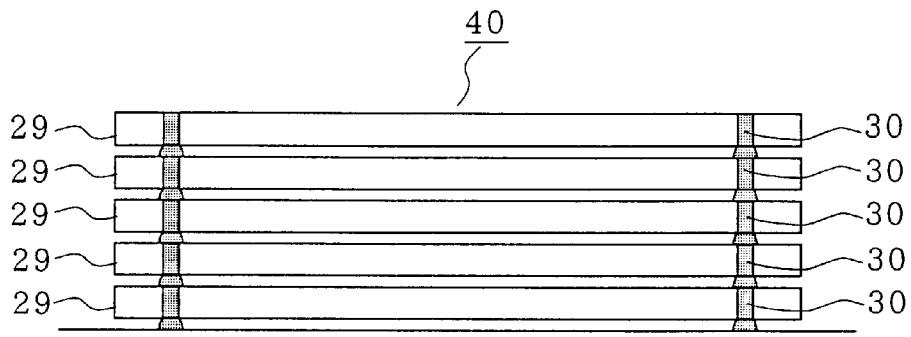
FIG. 3 is a front view of a semiconductor device produced by a method for processing a work according to the present invention.

FIG. 1A is a process chart showing a method (part 1) for machining a work to be machined according to Embodiment 1 of the present invention. As shown in FIG. 1A, in the method for machining a work to be machined, an oxide film 2 is patterned on a silicon substrate 1 having a plane-orientation (110) face, so that an opening portion is formed. A through-hole (prehole) 3 is formed by a laser light. When anisotropic etching is performed, the etching progresses and never stops before plane-orientation (111) faces appear, and the etching stops. As a result, a through-hole 4 with a high aspect ratio as shown in FIG. 1A is formed.

However, when only anisotropic etching is performed as shown in a comparative example of FIG. 1B, the etching stops at the plane-orientation (111) face (the angle between the (111) face and the surface of the silicon substrate is 35.4 degrees). Hence, if the relationship between plate thickness t and opening width (hole width) L is t>0.7L approximately, it is impossible to form any through-hole.

FIG. 2A is a process chart showing a method (part 2) for machining a work to be machined according to Embodiment 1 of the present invention. As shown in FIG. 2A, in the method for machining a work to be machined, an oxide film 2 is patterned on a silicon substrate 5 having a plane-orientation (100) face, so that an opening portion is formed. A through-hole 3 is formed by a laser light. When anisotropic etching is performed, the etching progresses and never stops before plane-orientation (111) faces appear, and the etching stops. As a result, a through-hole 6 with a high aspect ratio as shown in FIG. 2A is formed.

However, when only anisotropic etching is performed as shown in a comparative example of FIG. 2B, the etching stops at the plane-orientation (111) face (the angle between the (111) face and the surface of the silicon substrate is 54.7 degrees). Hence, if the relationship between plate thickness t and opening width (hole width) L is t>1.4L approximately, it is impossible to form any through-hole.

Although FIGS. 1A and 2A show the case where the etching clearly stops at each crystal face, this means that crystallinity is not collapsed by laser radiation. In other words, this means that there is no collapse of the crystal structure in all portions except the through-hole (for example, portions protected by the oxide film).

FIG. 3 is a front view of a semiconductor device 40 produced by applying the method for machining a work to be machined according to the present invention. This semiconductor device 40 has semiconductor chips 29 laminated as shown in FIG. 3. Incidentally, in the semiconductor device 40, the semiconductor chips 29 are laminated so that the semiconductor chips 29 are electrically connected to one another through metal bumps 30. In this respect, the semiconductor device 40 is different from a device having semiconductor chips disposed on opposite surfaces of one lead frame. Each of the semiconductor chips 29 is constituted by a storage device such as DRAM, SRAM or flash memory, a logic circuit, or the like. For example, a system LSI can be formed if the semiconductor chips 29 of the same or different devices are laminated.

Figure 4A:
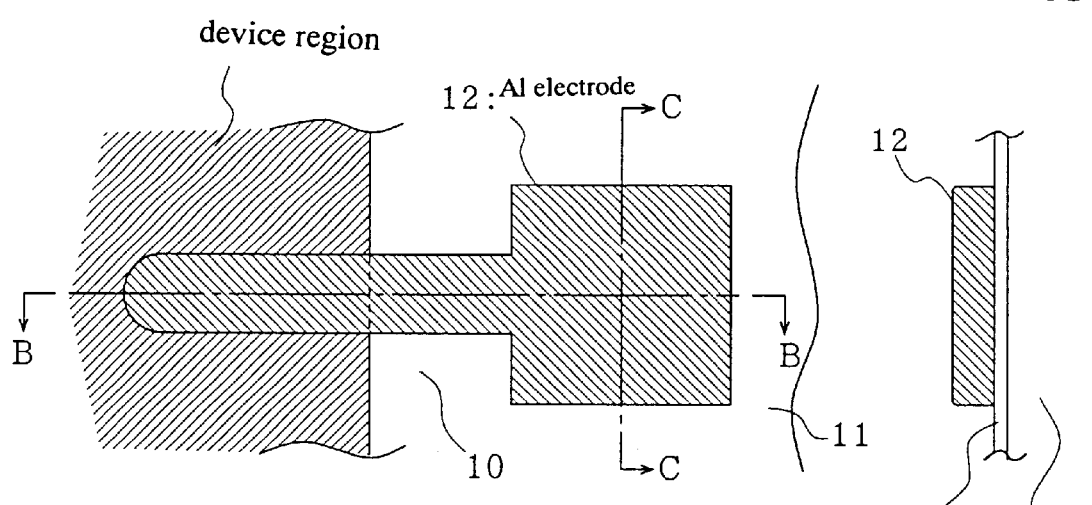
FIGS. 4A to 4C are explanatory diagrams of a silicon substrate in which various devices are formed on a surface of the silicon substrate.
Figure 4C:
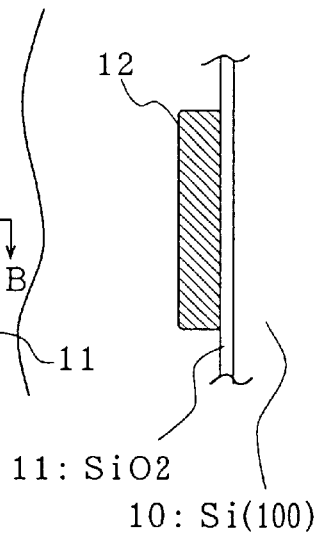
Figure 4B:
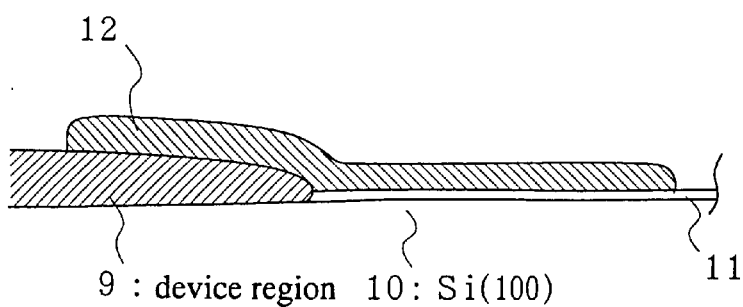

FIG. 4A is a partial plan view of a semiconductor chip that is being produced. FIG. 4B is a sectional view taken along the line B—B in FIG. 4A. FIG. 4C is a sectional view taken along the line C—C in FIG. 4A. A device region 9 including transistors, resistance elements, wiring, etc. and an aluminum film 12 as an electrode pad are formed on a silicon substrate 10 having a plane-orientation (100) face. The aluminum film 12 is formed on the silicon substrate 10 through an oxide film 11, or the like, and electrically connected to the device region 9.

Figure 5:
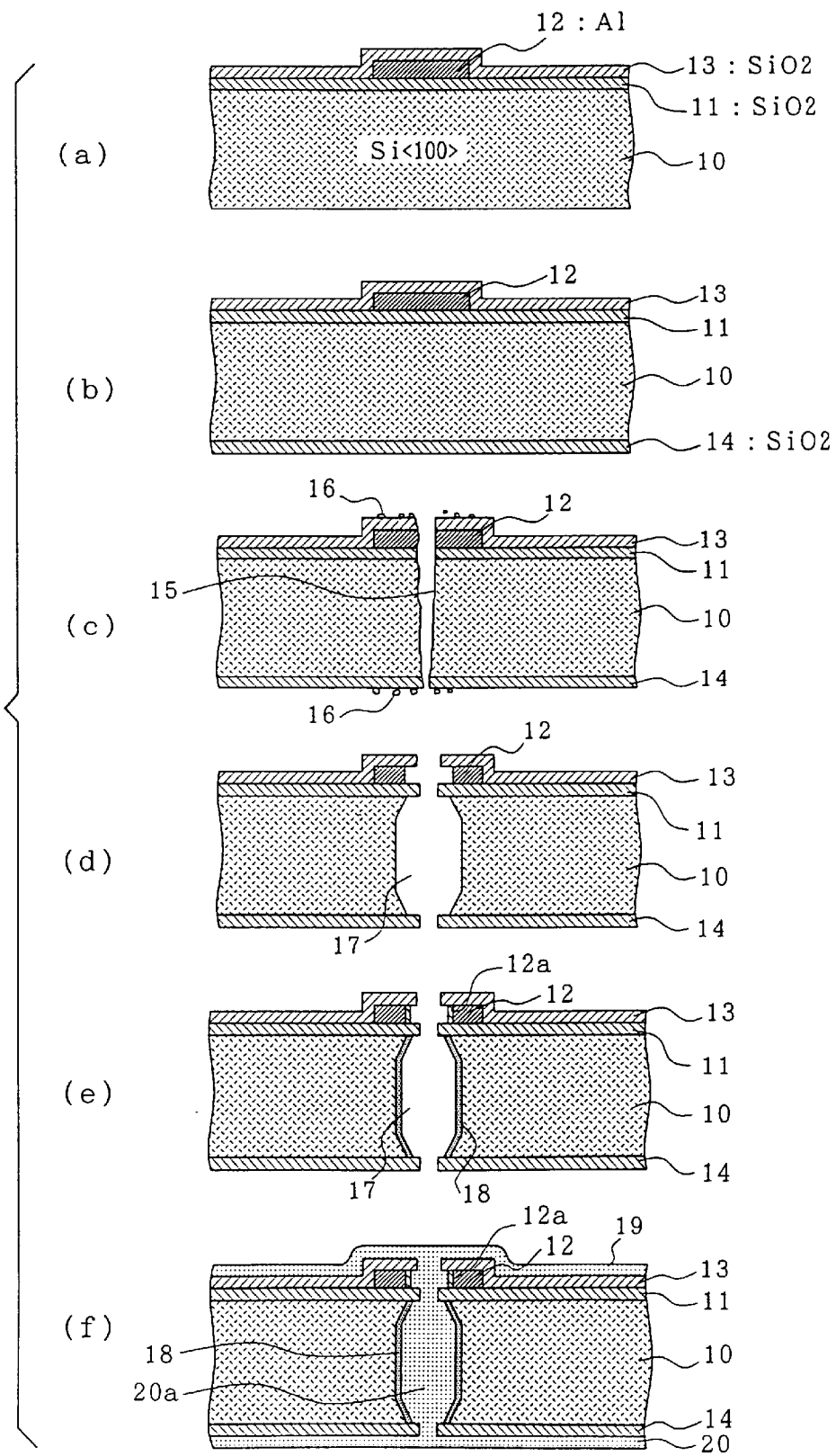
FIG. 5 is a process chart (part 1) of a method for producing the semiconductor device depicted in FIG. 3.
Figure 6:
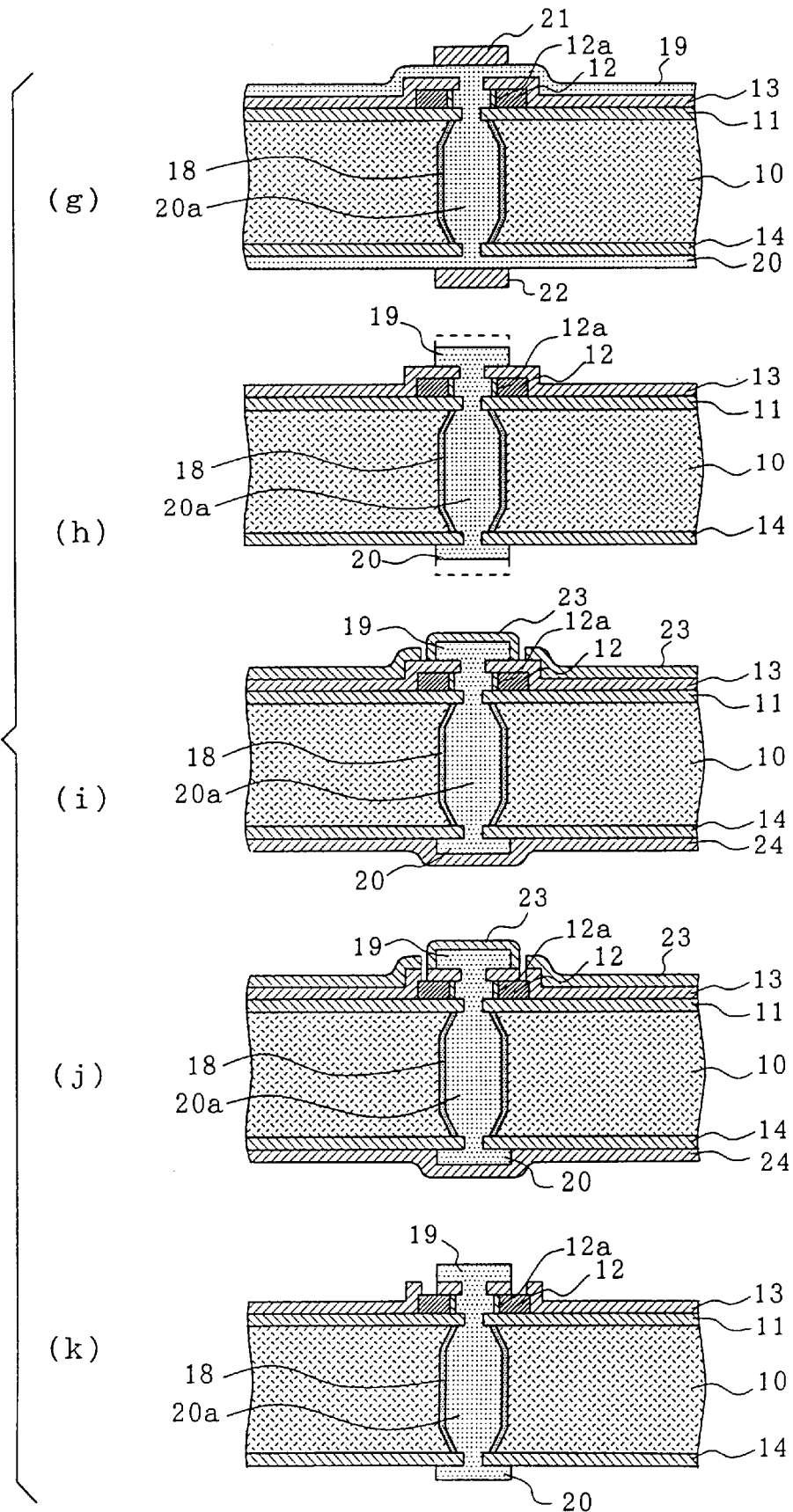
FIG. 6 is a process chart (part 2) of a method for producing the semiconductor device depicted in FIG. 3.
Figure 7:
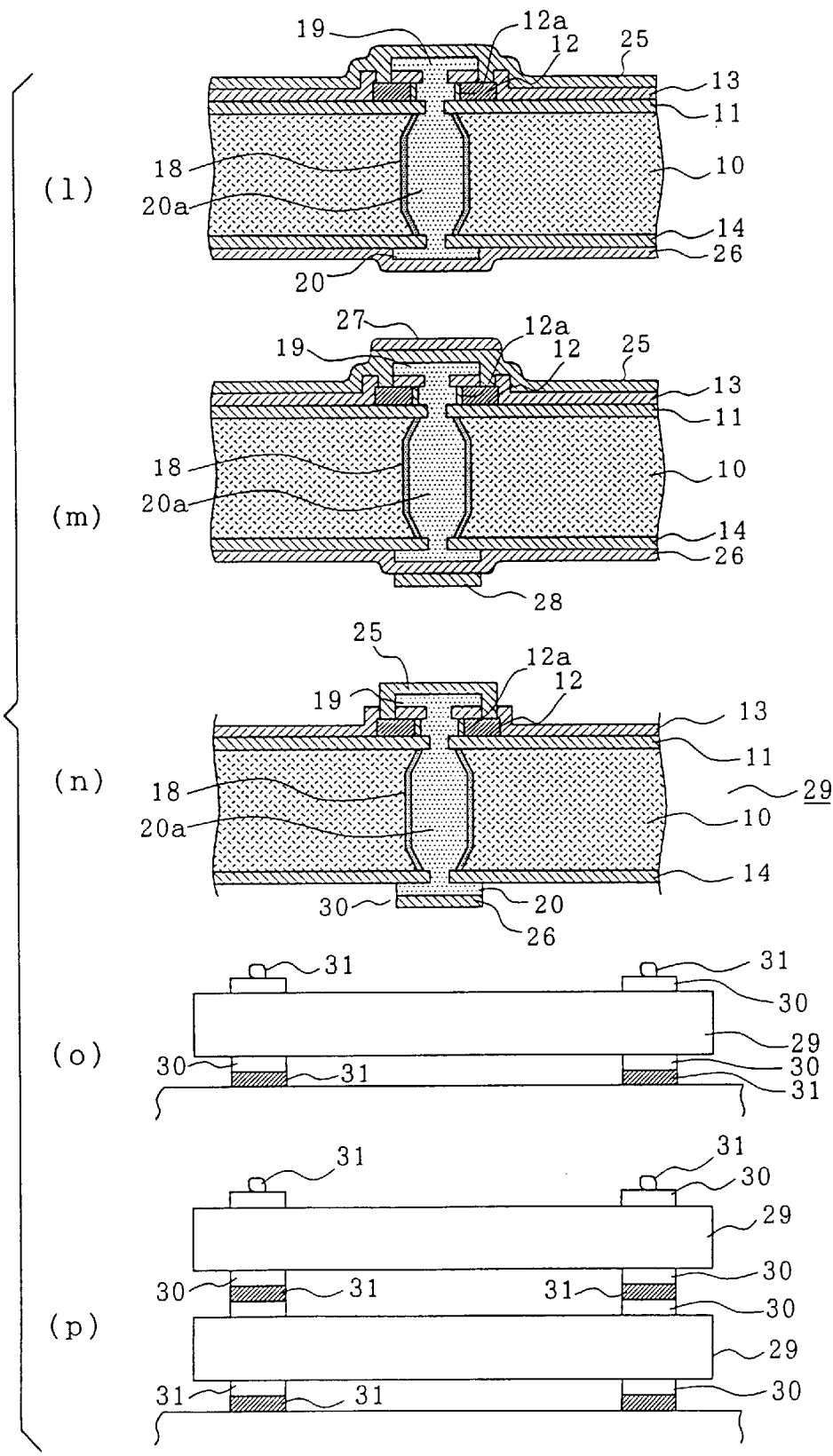
FIG. 7 is a process chart (part 3) of a method for producing the semiconductor device depicted in FIG. 3.

FIGS. 5 to 7 are process charts showing a method for producing the semiconductor device in FIG. 3. The method for producing the semiconductor device will be described below with reference to the process charts.

(a) On the aluminum film 12 which is formed on the silicon substrate 10 having a plane-orientation (100) face in a state shown in FIGS. 4A to 4C, a silicon oxide film 13 serving as an Si-etching resistant film is formed by a CVD method (or a PVD method, or the like). Although here is shown the case where the silicon oxide film 13 is used, the oxide film is not limited thereto so long as the oxide film has characteristic of an Si-etching resistant film (a film to protect the portions except silicon from etching). For example, a silicon nitride film may be used. This applies also to the following step (b).

(b) A silicon oxide film 14 is formed on the rear surface of the silicon substrate 10 by a CVD method (or a PVD method, or the like) in the same manner as described above. Incidentally, before this step, the rear surface may be subjected to a grinding step, or the like, to make the substrate per se thin.

(c) A prehole 15 piercing the aluminum film 12 is formed in the silicon substrate 10 by laser light radiation. On this occasion, dross 16 is produced in the periphery of a laser light incidence portion and a laser light exit portion. The dross 16 can be, however, removed easily because the dross 16 is deposited on the silicon oxide films 13 and 14 but not deposited on the silicon substrate 10. Incidentally, the laser light condition, etc., in this case will be described in the following Examples.

(d) Anisotropic etching is performed to enlarge the diameter of the prehole 15. On this occasion, the diameter of the hole formed in the aluminum film 12 by laser light radiation in the step (c) is also enlarged (backed up) by the etching. The dross 16 is removed by the etching. The conditions for the anisotropic etching will be described in the Examples that will be explained later.

(e) On the inner wall of the hole 17 formed by the anisotropic etching, a silicon oxide film 18 is formed by a CVD method (or a PVD method, or the like). On this occasion, an oxide film 12a is also formed on the inner wall of the hole formed in the aluminum film 12. In consideration of coverage, it is preferable that the silicon oxide film is formed on opposite surfaces. Incidentally, in Embodiment 1, the process in the step (i) et seq. in FIG. 6 is required for the oxide film 12a. The oxide film 12a maybe replaced by an inorganic film such as silicon nitride or by an organic film such as polyimide, Teflon, epoxy if the film has electrically insulating characteristic. Incidentally, in consideration of propagation delay characteristic, a low-dielectric-constant material is preferred.

(f) Copper plating (for example, electroless plating) is applied to the silicon substrate 10. Hence, copper plating layers 19 and 20 are formed on the front and rear surfaces, respectively, of the silicon substrate 10. At the same time, the hole 17 having the inner wall coated with the silicon oxide film 18 is filled with a copper plating material 20a.

(g) Resist films 21 and 22 are formed on the copper plating layers 19 and 20, respectively, by a photolithographic technique.

(h) Copper etching is performed so that all portions of the copper plating layers 19 and 20 except portions covered with the resist films 21 and 22 are removed.

(i) Resist films 23 and 24 are formed by a photolithographic technique. The resist film 23 is formed so that a part of the silicon oxide film 13 located on the aluminum film 12 is exposed to the outside.

(j) The part of the silicon oxide film 13 exposed to the outside is removed by dry etching. A part of the silicon oxide film 13 is left on the aluminum film 12 by the dry etching (this part is designated by the reference numeral 12a).

(k) The resist films 23 and 24 are stripped.

(l) Copper plating (for example, electroless plating) is applied to the whole surface so that copper plating layers 25 and 26 are formed.

(m) Resist films 27 and 28 are formed on the copper plating layers 25 and 26, respectively.

(n) All the copper plating layers 25 and 26 except the copper plating layers 25 and 26 located inside the resist films 27 and 28 are removed by copper etching. By the aforementioned steps, a semiconductor chip (IC chip) 29 is produced.

(o) Solder 31 or gold is deposited on each of the metal bumps 30 each composed of the copper plating layers 19 and 25, the copper plating material 2a and the copper plating layers 20 and 26. Incidentally, the solder 31 may be replaced by an anisotropic electrically conducting film (ACF), a ball bump, an electrically conducting adhesive agent, or the like.

(p) Another semiconductor chip 29 formed in the same manner as described above is placed on the solders 31 and welded thereto. When the aforementioned steps are repeated, a semiconductor device 40 of a multilayer structure as shown in FIG. 3 is obtained.

Although the above description has been made upon the silicon substrate 10 having a plane-orientation (100) face, the description applies also to a silicon substrate having a plane-orientation (110) face. Although the above description has been made upon the case where the silicon substrate 10 is irradiated with a laser light from the front surface to form a prehole, the present invention may be applied also to the case where the silicon substrate 10 is irradiated with a laser light from the rear surface. In this case, the diameter of the hole on the front surface side can be reduced so that the size of the metal bump can be reduced. Alternatively, the silicon substrate may be irradiated with laser lights from the front and rear surfaces, respectively, for machining.

Embodiment 2

Figure 8:
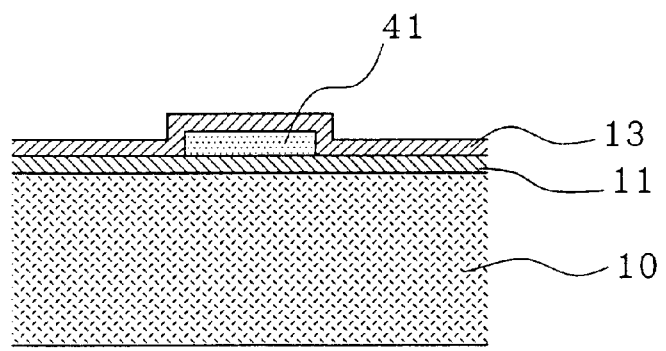
FIG. 8 is a process explanatory diagram for Embodiment 2 of the present invention.

FIG. 8 is a process explanatory diagram showing Embodiment 2 of the present invention. FIG. 8 corresponds to the step (a) in FIG. 5. In Embodiment 2, a gold film 41 is used as an electrode pad. In Embodiment 2, the steps (i) in FIG. 6 to (n) in FIG. 7 are not required because the oxide film 12a in the step (d) in FIG. 5 in Embodiment 1 is not formed on the gold film 41.

Embodiment 3

Figure 9:
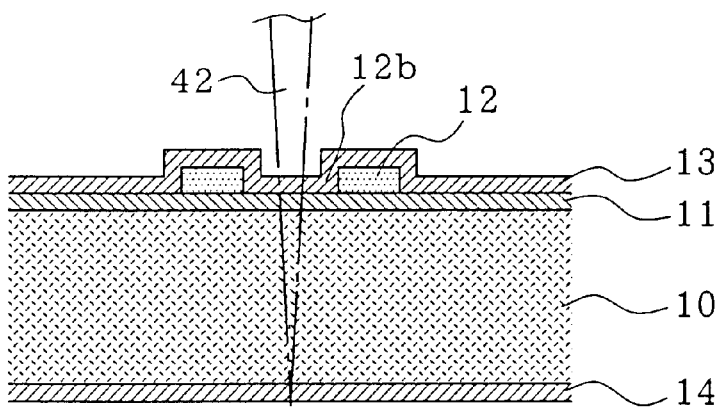
FIG. 9 is a process explanatory diagram of Embodiment 3 of the present invention.

FIG. 9 is a process explanatory diagram showing Embodiment 3 of the present invention. FIG. 9 corresponds to the steps (b) and (c) in FIG. 5. In Embodiment 3, a hole 12b is provided in the center portion of the aluminum film 12 in advance. Because the hole 12b is provided in the aluminum film 12 as described above, the aluminum film 12 is not moved back when irradiated with a laser light 42. Moreover, because the aluminum film 12 is covered with the silicon oxide films 11 and 13, the aluminum film 12 is not etched (not back) when subjected to anisotropic etching. Further, the oxide film 12a is not formed when the silicon oxide film 18 is formed. Hence, also in this Embodiment 3, the steps (i) in FIG. 6 to (n) in FIG. 7 are not required.

Embodiment 4

Figure 10:
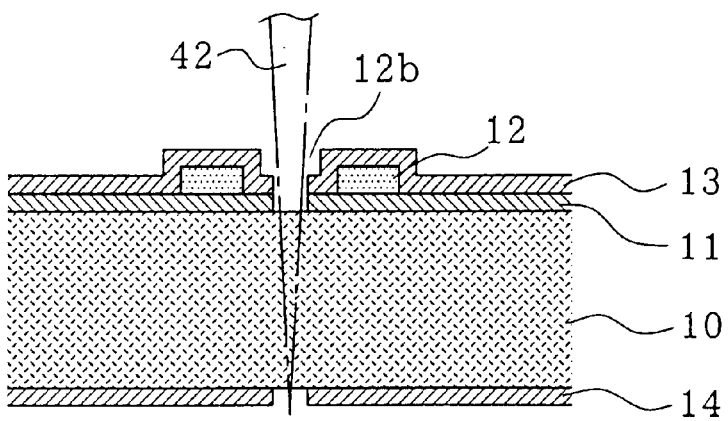
FIG. 10 is a process explanatory diagram for Embodiment 4 of the present invention.

FIG. 10 is a process explanatory diagram showing Embodiment 4 of the present invention. FIG. 10 corresponds to the step (a) in FIG. 5. In Embodiment 4, the hole 12b is provided in the center portion of the aluminum film 12 in advance in the same manner as in FIG. 9. Further, the silicon oxide film 11 is patterned so that a part of the silicon substrate 10 is exposed. Hence, the etching pattern (the opening size of the through-hole) in anisotropic etching can be standardized as well as backing-up of the aluminum film 12 can be avoided.

Embodiment 5

Figure 11:
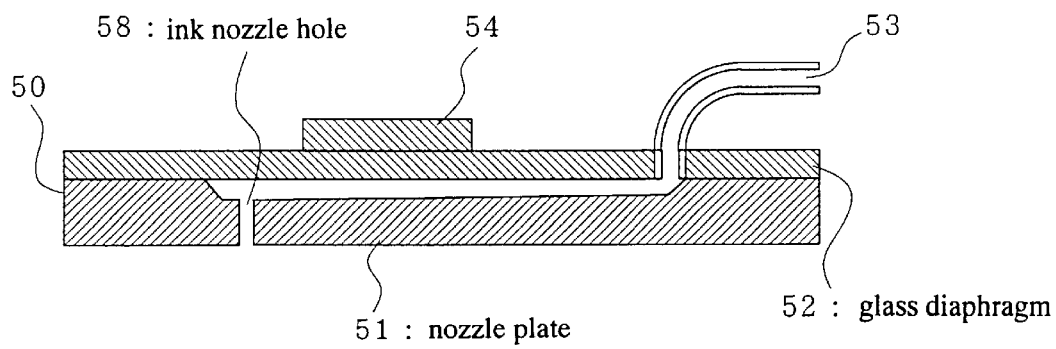
FIG. 11 is a sectional view of an ink jet head produced by a method for processing a work according to Embodiment 5 of the present invention.
Figure 12:
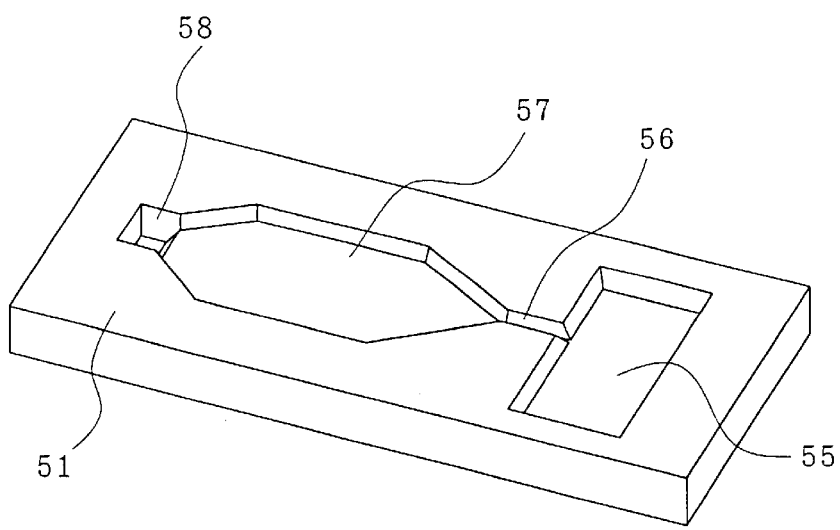
FIG. 12 is a perspective view of the nozzle plate depicted in FIG. 11.

FIG. 11 is a central sectional view of an ink jet head produced by applying a method for processing a work according to Embodiment 5 of the present invention. FIG. 12 is a perspective view of the nozzle plate in the ink jet head. The ink jet head 50 comprises a nozzle plate 51, a glass diaphragm 52 laminated on the nozzle plate 51, an ink tube 53 attached to the glass diaphragm 52, and a piezoelectric element 54 provided on the glass diaphragm 52. The nozzle plate 51 is constituted by a silicon substrate (having a plane-orientation (100) face or a plane-orientation (110) face). The nozzle plate 51 is provided with an ink chamber 55. Ink entering the ink chamber 55 is led to a cavity 57 through an ink supply port 56. The glass diaphragm 52 is stretched over the cavity 57. The diaphragm 52 is vibrated by the piezoelectric element 54. The ink in the cavity 57 is ejected from an ink nozzle hole 58 by the vibration of the diaphragm 52 so that the ink is deposited on a sheet of recording paper. In this manner, printing is performed.

Figure 13:
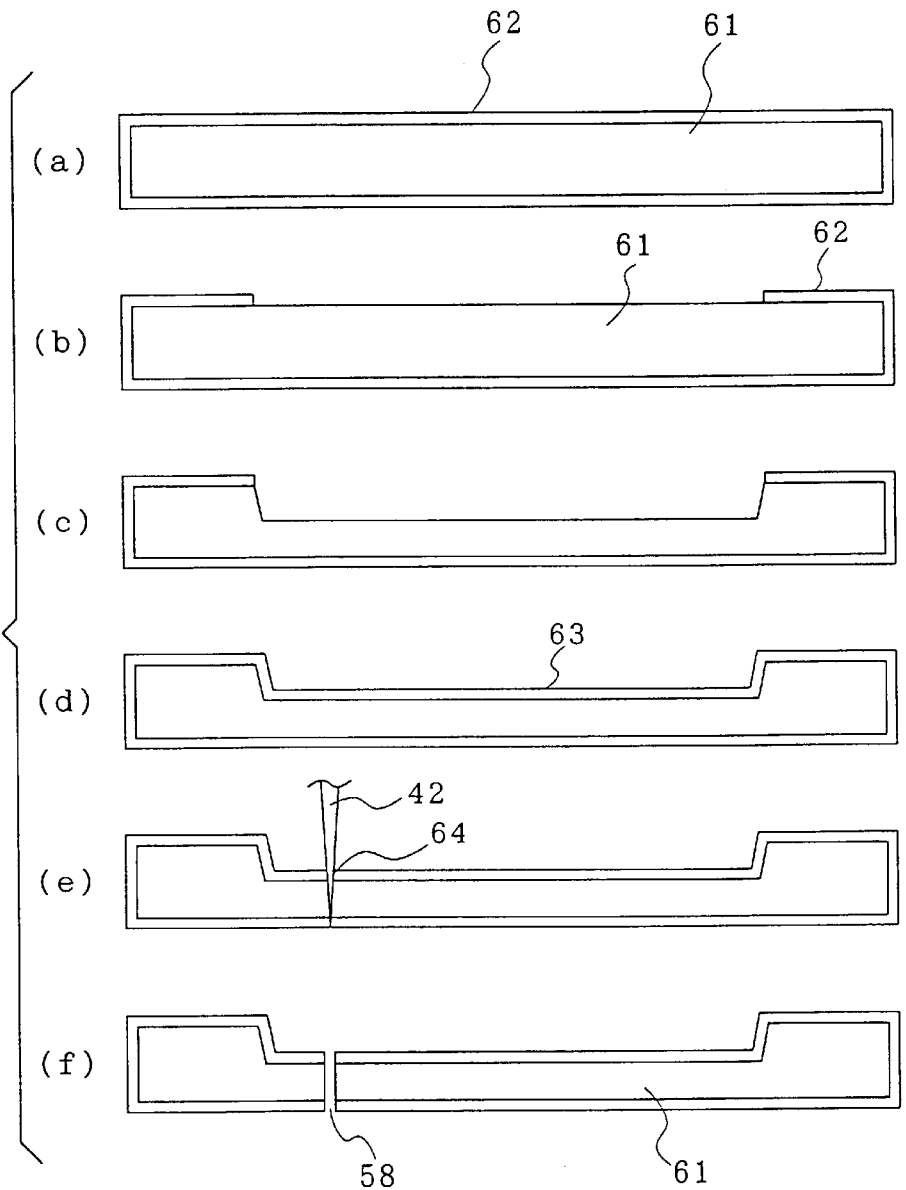
FIG. 13 is a process chart showing processing steps for producing the nozzle plate depicted in FIG. 11.

FIG. 13 is a diagram showing a process for producing the nozzle plate depicted in FIG. 11. The processing steps will be described below with reference to FIG. 13.

(a) A thermal oxide film 62 is formed on a silicon substrate 61.

(b) The thermal oxide film 62 is patterned into a shape corresponding to the ink chamber 55, the ink channel 56 and the cavity 57 by photolithography and hydrofluoric acid etching.

(c) The silicon substrate 61 is etched with an alkaline solution to a predetermined depth. Thus, the ink chamber 55, the ink channel 56 and the cavity 57 are formed.

(d) A thermal oxide film 63 is formed on the whole surface by thermal oxidation.

(e) The thermal oxide film 63 is irradiated with a laser light 42 from above. Thus, a prehole 64 for forming the ink nozzle hole 58 is formed.

(f) The ink nozzle hole 58 is formed by anisotropic etching with an alkaline solution. Although dross is produced when the prehole 64 is formed, the dross is removed by the anisotropic etching.

Embodiment 6

Figure 14A:
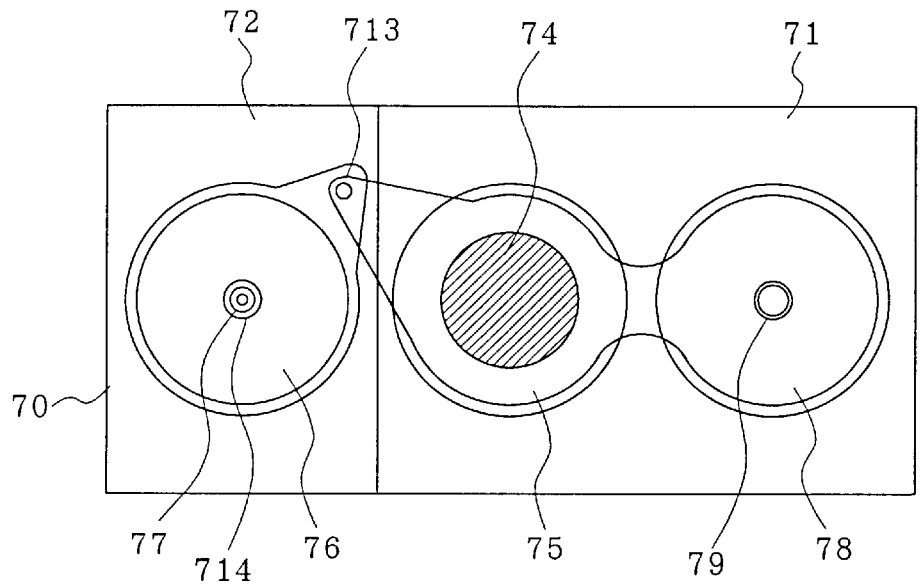
FIGS. 14A and 14B are plan and sectional views, respectively, of a micro-pump produced by the application of a method for processing a work according to Embodiment 6 of the present invention.
Figure 14B:
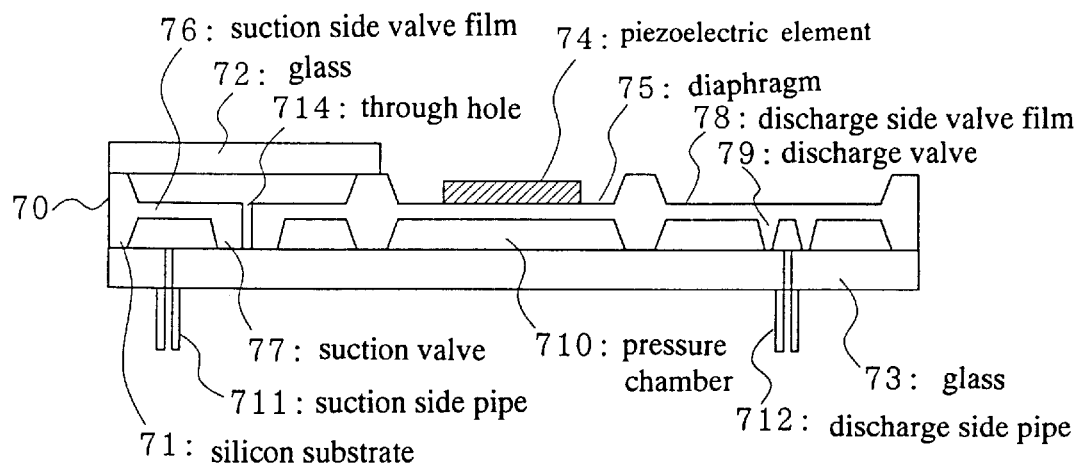

FIGS. 14A and 14B are plan and sectional views, respectively, of a micro-pump produced by a method for processing a work according to Embodiment 6 of the present invention. The micro-pump 70 has a structure in which a silicon substrate 71 is sandwiched between two glass plates 72 and 73. A fluid is sucked through a suction side pipe 711 provided in the glass substrate 73. The sucked fluid is delivered into a discharge side pipe 712. The principle of the operation thereof is as follows.

When a voltage is applied to a piezoelectric element 74 stuck to a diaphragm 75 formed in the center portion of the silicon substrate 71, the diaphragm 75 is bent to thereby change the inside pressure of a pressure chamber 710. Further, a suction side valve film 76 and a discharge side valve film 78 spatially connected to the pressure chamber 710 are displaced to thereby open/close a suction valve 77 and a discharge valve 79. As a result, a fluid is forcedly fed from the suction side pipe 711 to the discharge side pipe 712. Incidentally, the pressure chamber 710 is communicated with a space on the upper side of the suction side valve film 76 and with a space on the lower side of the discharge side valve film 78.

Figure 15:
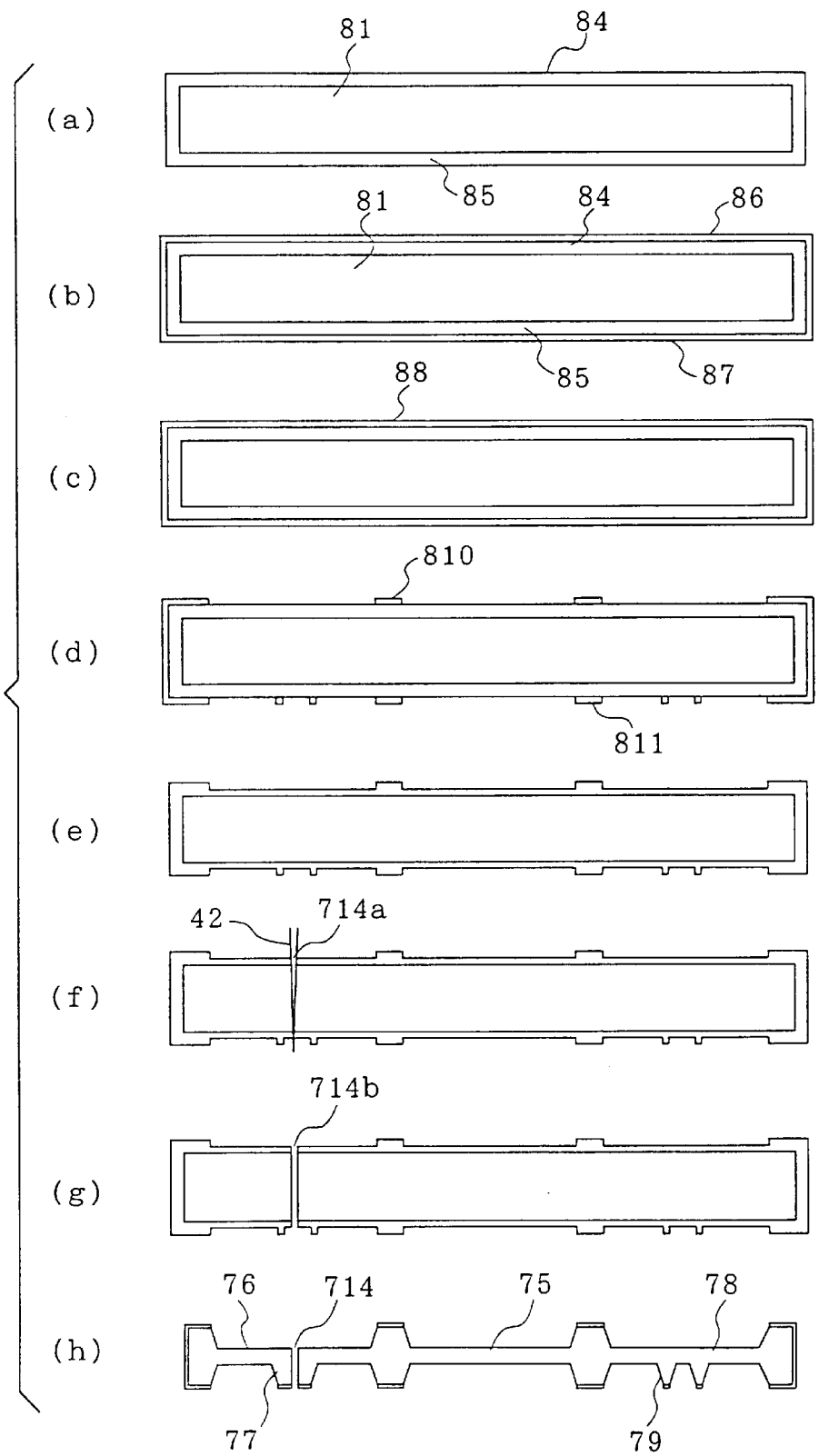
FIG. 15 is a step view showing a process for producing the silicon substrate depicted in FIG. 14.

FIG. 15 is a diagram showing a process for producing the silicon substrate 71 depicted in FIGS. 14A and 14B. The processing steps will be described below with reference to FIG. 15.

(a) Silicon oxide films 84 and 85 each 15 $\mu$m thick are formed on a silicon substrate 81 having its opposite surfaces polished and a thickness of 280 $\mu$m.

(b) Positive type photo resists 86 and 87 are applied onto the silicon oxide films 84 and 85. The detailed conditions for application of the resist films are as follows. First, a resist is applied onto the silicon oxide film 84 by a spin coating method. Then, pre-baking is performed to form the resist film 86. Then, a resist is applied onto the silicon oxide film 85 in the aforementioned manner by a spin coating method. Then, pre-baking is performed at 100° C. for 30 minutes to form the resist film 87. The resist film 86 is subjected to pre-baking for 40 minutes in total.

(c) Then, the resist film 87 is subjected to exposure and development of a pattern corresponding to a through-hole 714 and a through-hole (not shown) for connecting the pressure chamber 710 to the space on the upper side of the suction side valve film 76. Thus, a resist pattern 88 is formed but post-baking is not performed. This is because the resist films 86 and 87 will be subjected to the formation (exposure and development) of another pattern later.

(d) Then, the silicon oxide film 85 is selectively etched with a hydrofluoric acid etching solution. Because the resist films 86 and 85 used as etching masks for hydrofluoric acid etching are not subjected to baking (post-baking) at a high temperature, remaining film portions of the resist films 85 and 86 are kept photosensitive and are not stripped. Hence, in the next step, the remaining film portions are further patterned by pattern exposure and development.

(e) The resist film 86 is subjected to pattern exposure corresponding to the suction side valve film 76, the diaphragm 75, the suction side valve film 76, etc. The resist film 87 is subjected to exposure of a pattern corresponding to the suction side valve film 76, the suction valve 77, the diaphragm 75, the discharge side valve film 78, the discharge valve 79, etc. Then, development of the resist film 86 and development of the resist film 87 are performed simultaneously to thereby form resist patterns 810 and 811.

(f) Then, laser light irradiation is performed so that a portion of the silicon oxide film 85 corresponding to the through-hole 714 is irradiated with a laser light 42 to thereby form a prehole 714a.

(g) Then, anisotropic etching with an alkaline solution is performed. On this occasion, the etching is performed, for example, by use of a KOH aqueous solution with a concentration of 25% by weight at a temperature of 80° C. The prehole is enlarged by the etching to thereby form a hole 714b corresponding to the through-hole 714. Dross produced at the time of the formation of the prehole is removed by the anisotropic etching.

(h) Anisotropic etching with an alkaline solution is further performed. As a result, portions of the oxide films 84 and 85, for example, having a thickness of 0.08 $\mu$m are eliminated so that the base of silicon is exposed. The base of silicon is continuously etched to thereby form the suction valve film 76, the suction valve 77, the diaphragm 75, the discharge side valve film 78, the discharge valve 79, etc. in FIG. 11.

Embodiment 7

Figure 16:
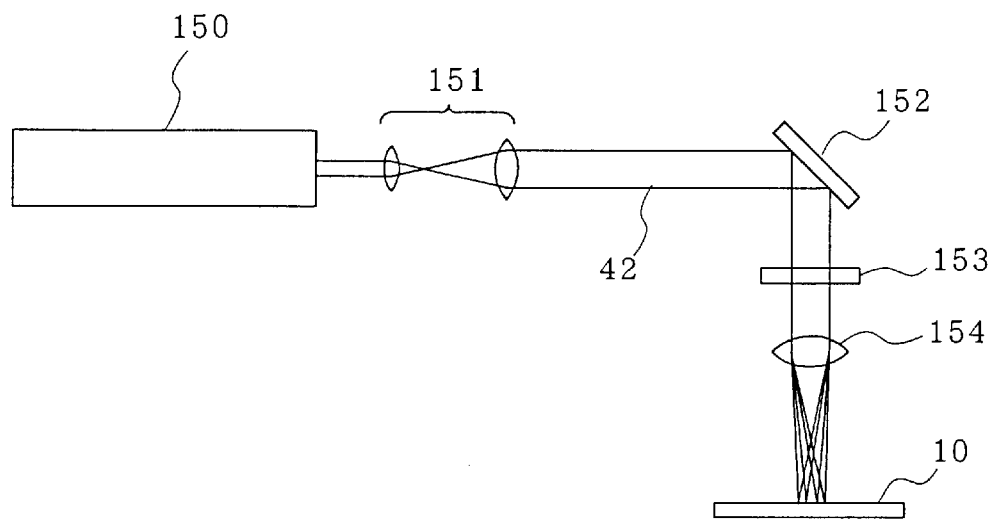
FIG. 16 is a diagram showing an exemplary construction of an apparatus used when preholes are formed in a silicon substrate by a laser light in each of the aforementioned Embodiments.

FIG. 16 is a diagram showing the construction of an apparatus used when preholes are formed in a silicon substrate by a laser light in each of the aforementioned Embodiments. The laser light 42 from a laser light source 150 reaches a phase grating 153 via a beam expander 151 and a reflection mirror 152. Then, the laser light 42 is splited by the phase grating 153 so that the silicon substrate 10 is irradiated with the splited laser lights.

Figure 17A:
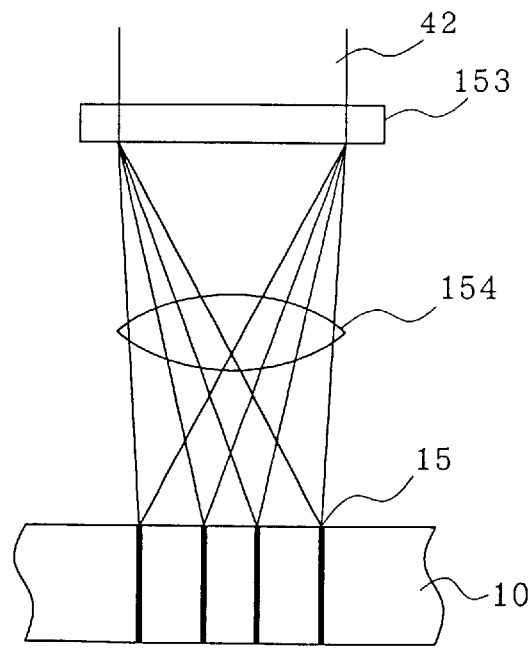
FIGS. 17A and 17B are explanatory diagrams showing a state in which processing is performed by the apparatus depicted in FIG. 16.
Figure 17B:
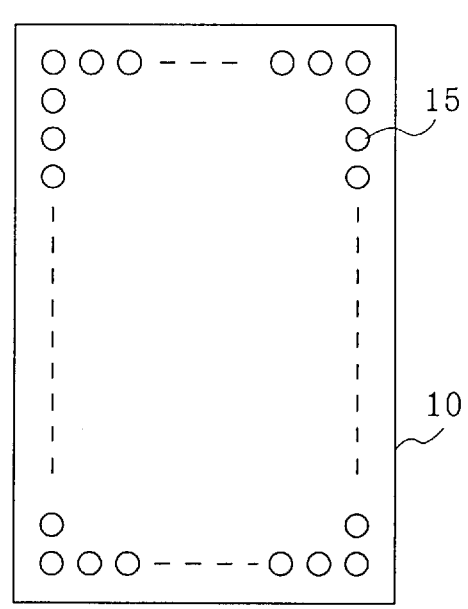

FIGS. 17A and 17B are explanatory diagrams showing this state. In this example, the laser light 42 is splited into four by the phase grating 153 so that the silicon substrate 10 is irradiated with splited laser lights to thereby form preholes 15. With respect to the splitting, for example, the laser light is first splited in an X direction (horizontally) and then splited in an Y direction (vertically) after the direction is rotated by 90 degrees (after the phase grating 153 is rotated or the silicon substrate 10 is rotated). Alternatively, the laser light may be splited in the X and Y directions simultaneously by the phase grating 153. Because a plurality of preholes 15 can be formed simultaneously in the aforementioned manner, the processing time can be shortened. Moreover, two-dimensional splitting can be also performed. In this case, one chip or one wafer can be processed collectively.

Embodiment 8

Figure 18:
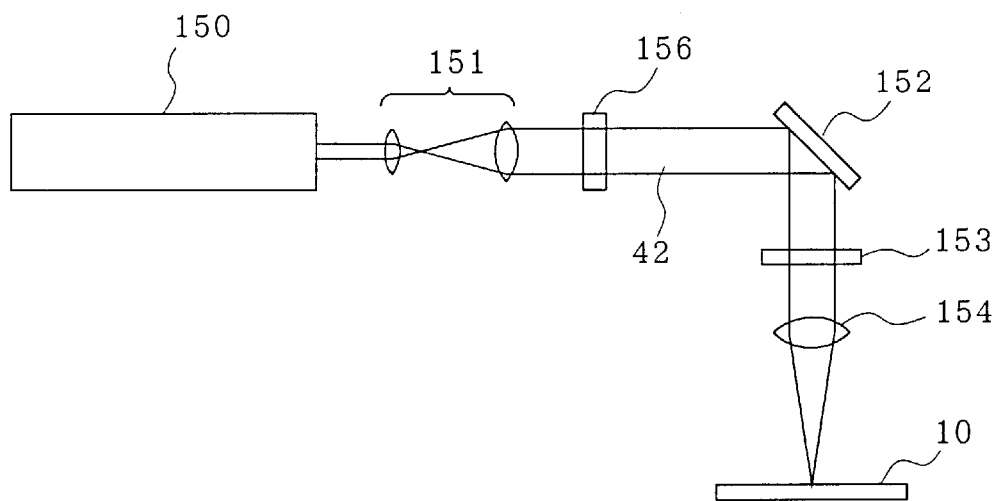
FIG. 18 is a diagram showing another exemplary construction of the apparatus used when preholes are formed in a silicon substrate by a laser light in each of the aforementioned Embodiments.

FIG. 18 is a diagram showing another construction of an apparatus used when preholes are formed in a silicon substrate by a laser light in each of the aforementioned Embodiments. In FIG. 18, a $\lambda/4$ polarizing plate 156 is provided on the exit side of the beam expander 51. The angle between the plane of polarization (linear polarization) of the laser light and the $\lambda/4$ polarizing plate 156 is optimized so that the laser light 42 is circularly polarized.

Figure 19A:
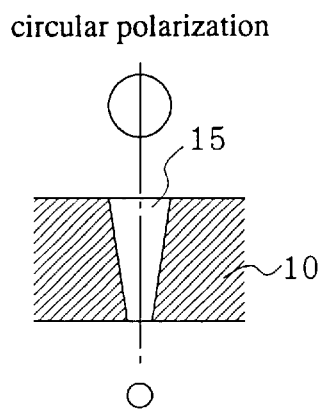
FIGS. 19A to 19D are explanatory diagrams showing the respective states of preholes in the case where a laser light is circularly polarized by the apparatus depicted in FIG. 18, in the case where a laser light is randomly polarized and in the case where a laser light is linearly polarized (S-polarized).
Figure 19B:
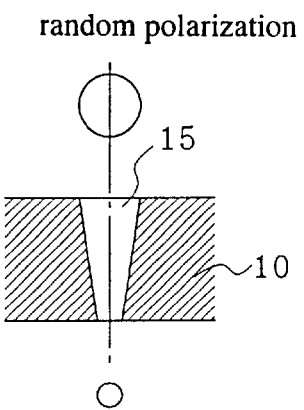
Figure 19C:
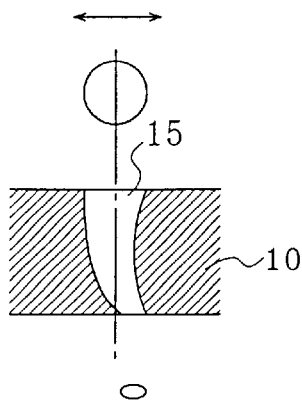
Figure 19D:
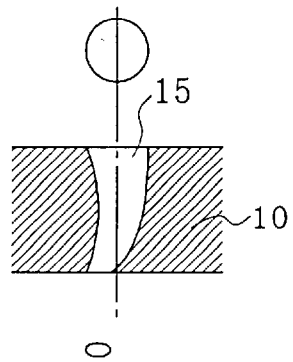

FIG. 19A is an explanatory diagram showing a state of the processed hole when the laser light is circularly polarized by the apparatus depicted in FIG. 18. FIG. 19B is an explanatory diagram showing a state of the processed hole when the laser light is randomly polarized. As illustrated in the drawings, it is apparent that the prehole 15 is not bent but formed straightly. FIGS. 19C and 19D are explanatory diagrams showing states of the processed holes in the case where the laser light is linearly polarized. As illustrated in the drawings, it is apparent that the preholes 15 are bent and distorted. It is conceivable that this is a phenomenon caused by difference in absorption factor between P-polarization and S-polarization with respect to the inner wall (see FIGS. 20A and 20B). It is conceivable that, when processing is once accelerated in a direction biased to one side, the bias is further accelerated by the light guiding effect of the through-hole. On the contrary, when the laser light is polarized randomly or circularly, an S-polarized beam and a P-polarized beam are radiated randomly. Hence, because there is no bias of S-polarization and P-polarization, the phenomenon that the through-hole is bent can be suppressed effectively.

Figure 20A:
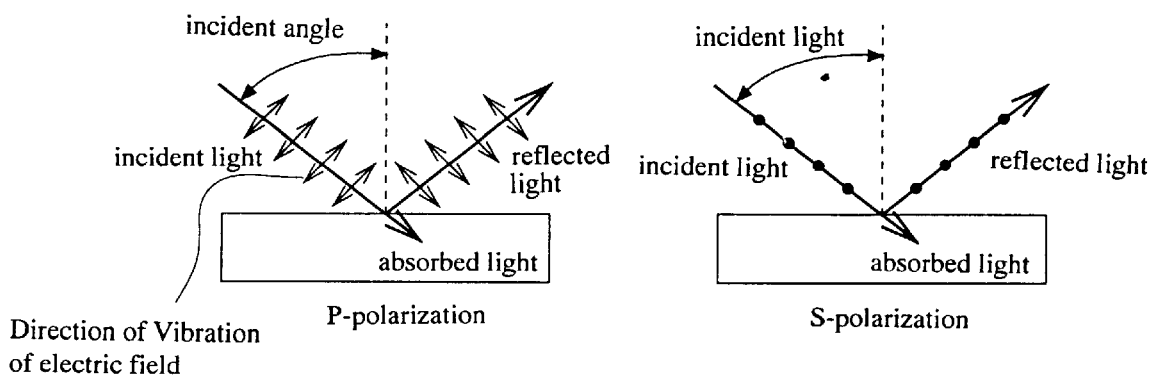
FIGS. 20A and 20B are diagrams showing the relationship between polarization and laser light absorption factor of silicon.
Figure 20B:
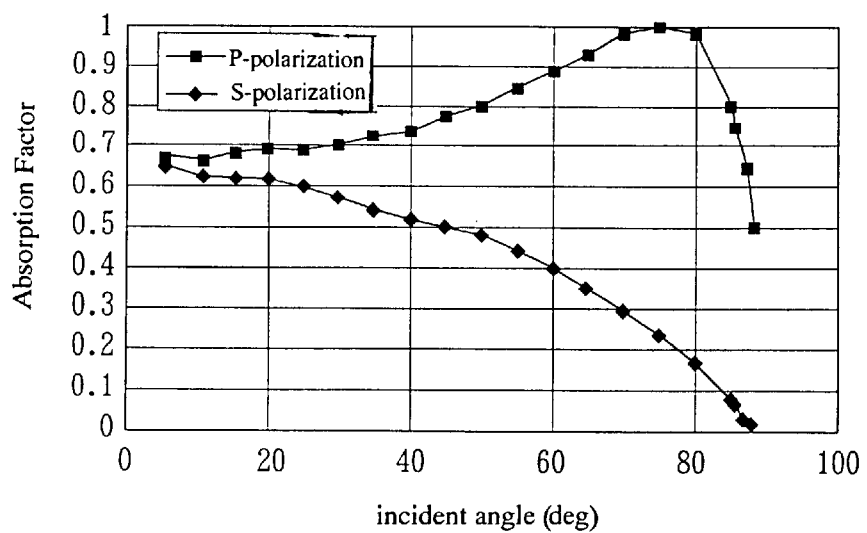

FIGS. 20A and 20B are diagrams showing the relationship between linear polarization and laser light absorption factor with respect to silicon (Si). From these drawings, the absorption factor in P-polarization is higher (especially, maximized at an angle of from 70 to 80°) than that in S-polarization. Hence, it is conceivable that the possibility of bending becomes high in the case of linear polarization.

Embodiment 9

Although each of the aforementioned Embodiments has been described upon the case where etching is performed after a perpendicular hole is formed in a silicon substrate by laser machining, the present invention is not limited thereto and may be applied to the case where an oblique hole is formed by laser machining. Specific examples thereof will be described later. When an oblique hole is formed in a silicon substrate having a plane-orientation (100) face by laser machining, the following advantages are provided like the case of a silicon substrate having a plane-orientation (110) face.
(a) Because it is possible to form a hole so straight as not to be widened inward, the pitch between holes can be reduced more greatly.
(b) Because the width of the hole can be formed to be equal to the size of the oxide film, the width of the hole need not be controlled by the etching time.
(c) Because the sectional shape of the hole can be defined on the basis of plane-orientation (111) faces, there is no variation in shape.

An example of the case where oblique holes are formed by laser machining will be described below in comparison with the case of perpendicular holes.

Figure 21:
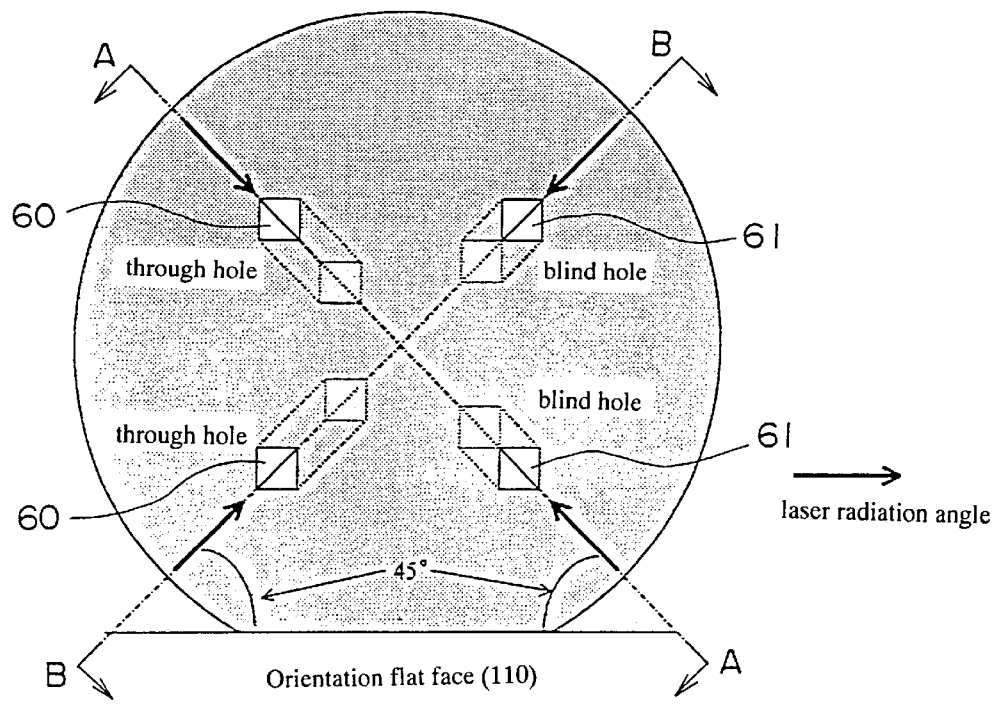
FIG. 21 is a plan view showing the case where oblique holes inclined by 45 degrees with respect to a silicon substrate having a plane-orientation (100) face are formed by laser machining and etching.
Figure 22A:
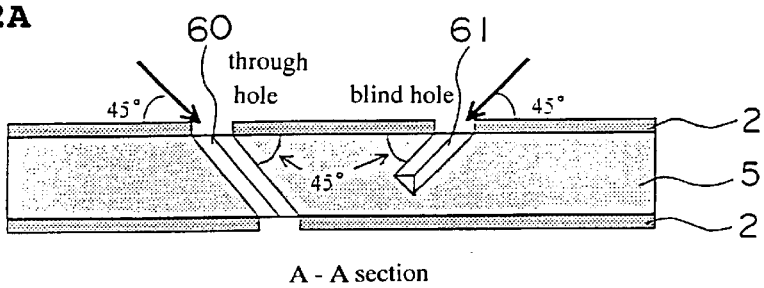
FIGS. 22A and 22B are sectional views taken along the line A—A in FIG. 21 and the line B—B in FIG. 21 respectively.
Figure 22B:
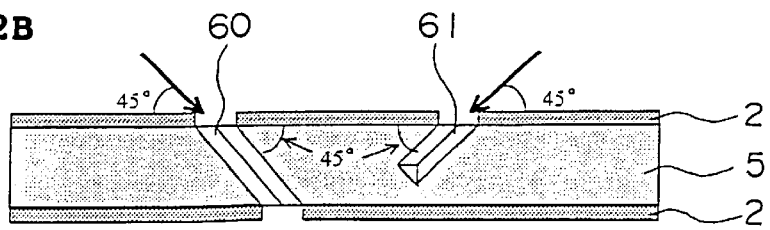

FIG. 21 is a plan view showing the case where oblique holes inclined by 45 degrees with respect to the surface of a silicon substrate 5 having a plane-orientation (100) face are formed by laser machining and etching. FIG. 22A is a sectional view taken along the line A—A in FIG. 21. FIG. 22B is a sectional view taken along the line B—B in FIG. 21. Here is shown a shape in the case where a plane-orientation (111) face appears and etching stops. Incidentally, in the drawings, through-holes 60 and blind holes (non-through-holes) 61 are shown as examples of oblique holes.

Figure 23:
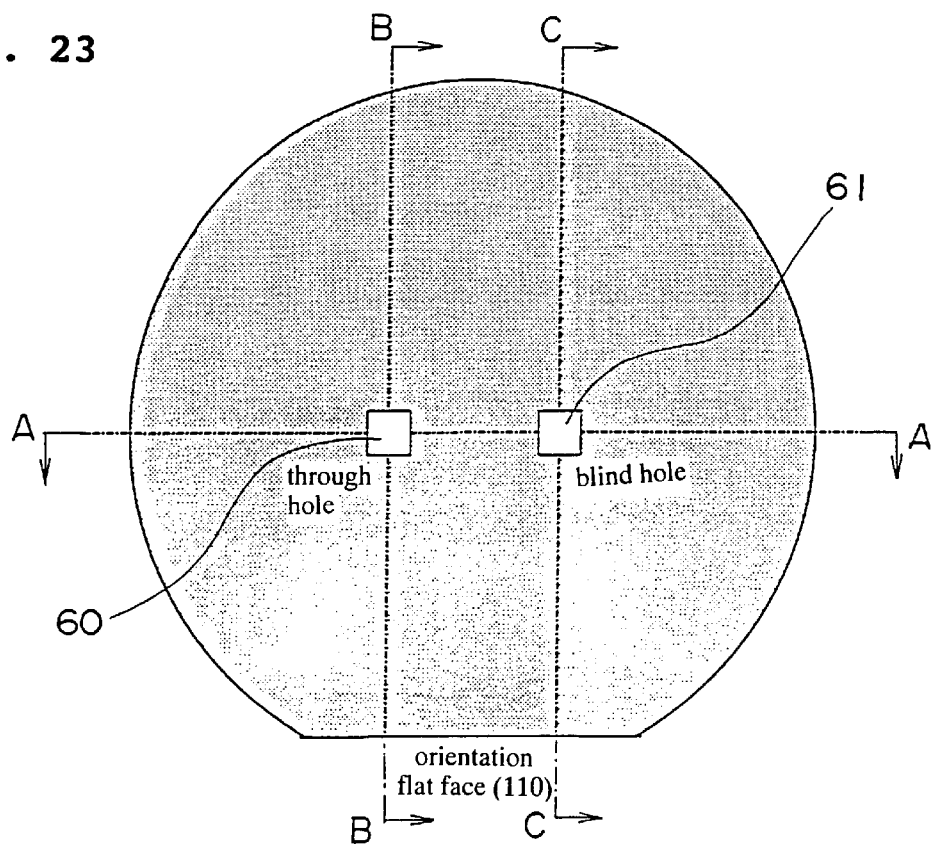
FIG. 23 is a plan view showing the case where holes perpendicular to a surface of a silicon substrate having a plane-orientation (100) face are formed by laser machining and etching.
Figure 24A:
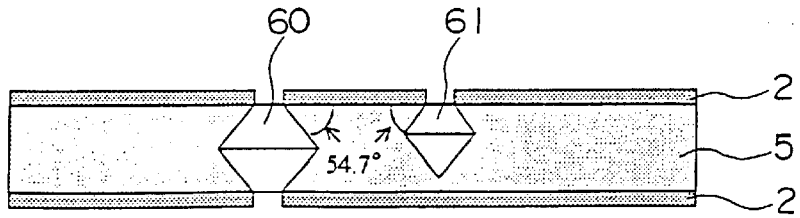
FIGS. 24A, 24B and 24C are sectional views taken along the line A—A in FIG. 23, the line B—B in FIG. 23 and the line C—C in FIG. 23, respectively.
Figure 24B:
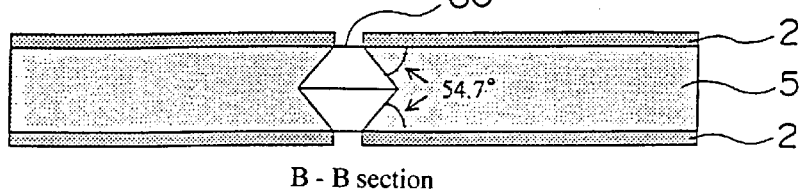
Figure 24C:
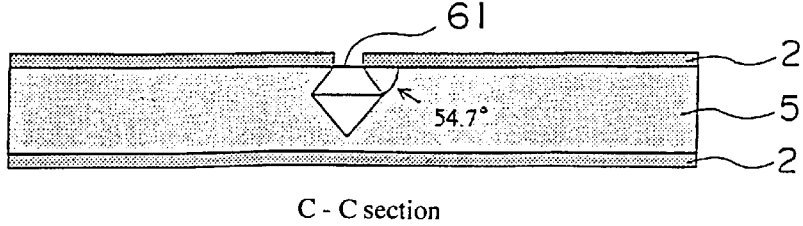

FIG. 23 is a plan view showing the case where holes perpendicular to the surface of a silicon substrate 5 having a plane-orientation (100) face are formed by laser machining and etching. FIG. 24A is a sectional view taken along the line A—A in FIG. 23. FIG. 24B is a sectional view taken along the line B—B in FIG. 23. FIG. 24C is a sectional view taken along the line C—C in FIG. 23. Here is also shown a shape in the case where a plane-orientation (111) face appears and etching stops.

Figure 25:
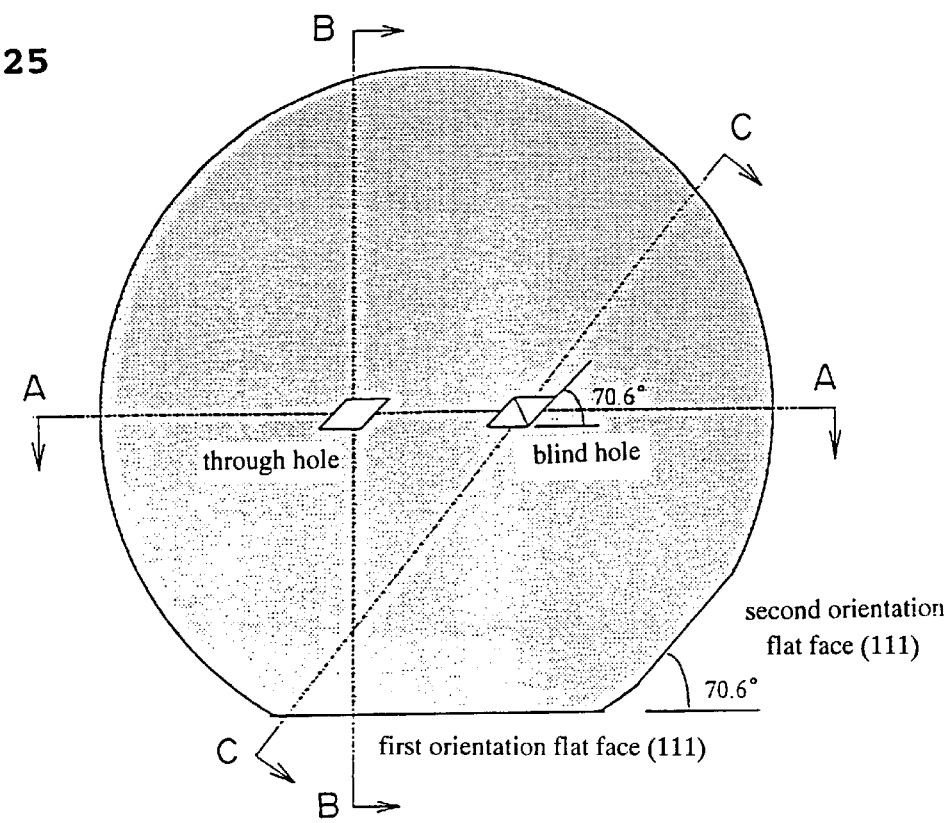
FIG. 25 is a plan view showing the case where holes perpendicular to a surface of a silicon substrate having a face of plane-orientation (110) are formed by laser machining and etching.
Figure 26A:
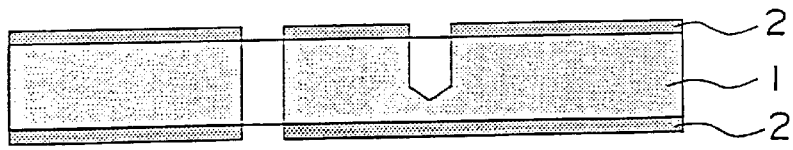
FIGS. 26A, 26B and 26C are sectional views taken along the line A—A in FIG. 25, the line B—B in FIG. 25 and the line C—C in FIG. 25, respectively.
Figure 26B:
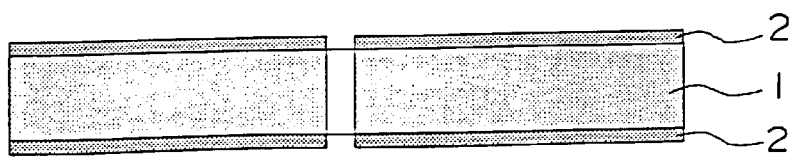
Figure 26C:
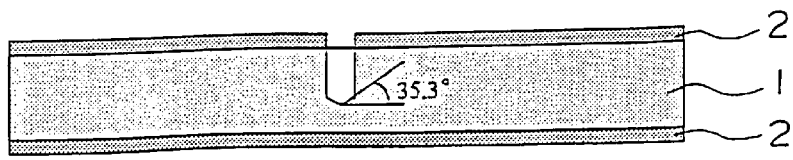

FIG. 25 is a plan view showing the case where holes perpendicular to the surface of a silicon substrate 5 having a plane-orientation (110) face are formed by laser machining and etching. FIG. 26A is a sectional view taken along the line A—A in FIG. 25. FIG. 26B is a sectional view taken along the line B—B in FIG. 25. FIG. 26C is a sectional view taken along the line C—C in FIG. 25. Here is also shown a shape in the case where a plane-orientation (111) face appears and etching stops.

As apparent from these drawings, the aforementioned advantages (a) to (c) are provided in the case where oblique holes are formed in a silicon substrate having a plane-orientation (100) face by laser machining.

Embodiment 10

Figure 27A:
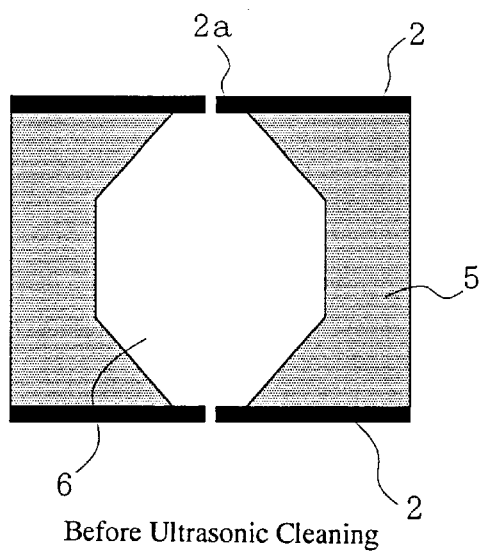
FIGS. 27A and 27B are explanatory diagrams showing the states before and after ultrasonic cleaning.
Figure 27B:
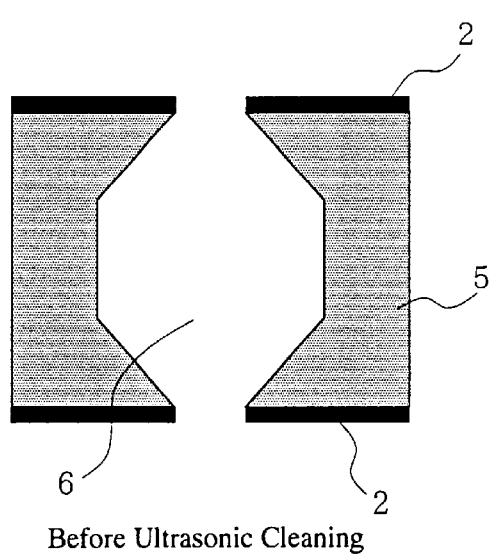

Incidentally, after etching, the oxide film may be overhung so that the oxide film is left as a fluted shape in the periphery of the hole. Particularly when the oxide film is merely pierced by a laser light without patterning, this phenomenon becomes remarkable as shown in FIG. 27A. In such a case, ultrasonic cleaning in water (pure water or ordinary water) is performed for about 5 minutes so that the overhung fluted oxide film 2a can be removed easily as shown in FIG. 27B. Generally, the oxide film is (entirely) removed by a hydrofluoric acid etching solution. If the oxide film is permitted to be left on the surface, such a dangerous step as using hydrofluoric acid can be omitted.

Embodiment 11

Figure 28A:
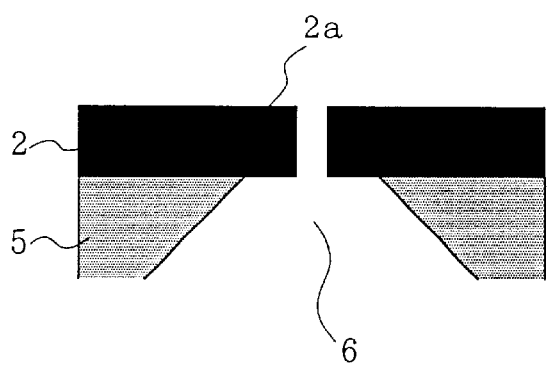
FIGS. 28A and 28B are explanatory diagrams showing the states before and after etching.
Figure 28B:
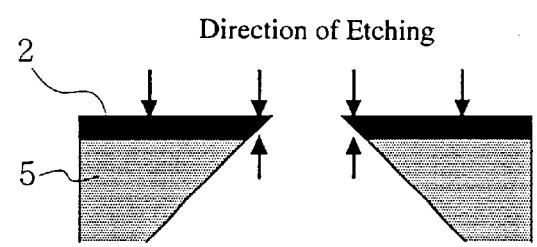

Because the oxide film is not perfectly corrosion-resistant to the etching solution (KOH), the oxide film is etched little by little. Hence, the oxide film is subjected to etching from the inside of the hole. If the oxide film is formed to be so thin that the oxide film (which is etched particularly easily at the fluted portion) is eliminated at the point of time when etching is required, or if the etching time is set to be so extremely long, the overhung fluted oxide film 2a as shown in FIG. 28A can be removed as shown in FIG. 28B. Also in this case, such a dangerous step as using hydrofluoric acid can be omitted if the oxide film is permitted to be left on the surface.

Embodiment 12

Although the aforementioned Embodiments have been described upon the case where through-holes are formed mainly, the present invention may be applied also to the case where preceding grooves are formed by a laser light and then etched to form a deep groove.

Figure 29:
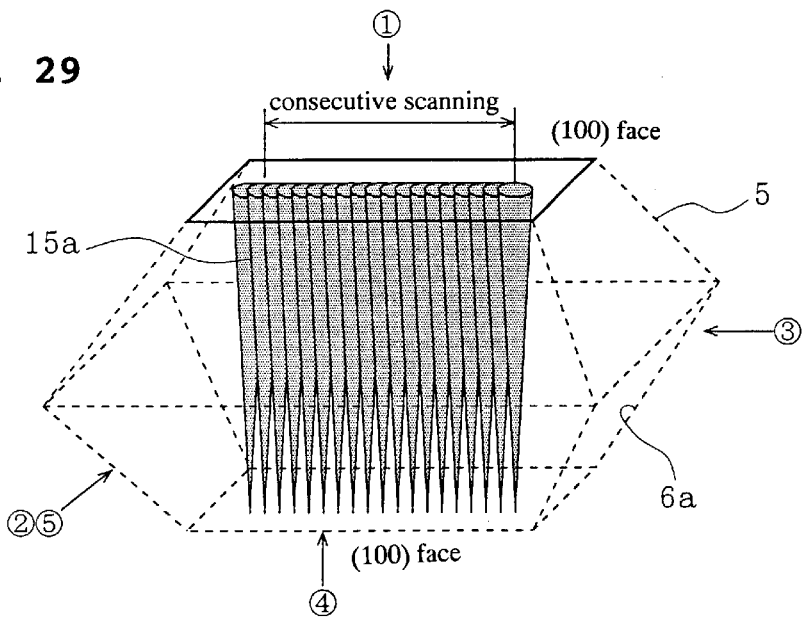
FIGS. 29 to 31 are explanatory diagrams showing the case where a deep groove is formed.

FIG. 29 is an explanatory diagram for the case where a deep groove is formed. Anisotropic etching is applied to a silicon substrate 5 having continuous preholes 15a which are formed by laser light radiation with continuous scanning. As a result, a deep groove spread inside the silicon substrate 5 can be formed.

Figure 30:
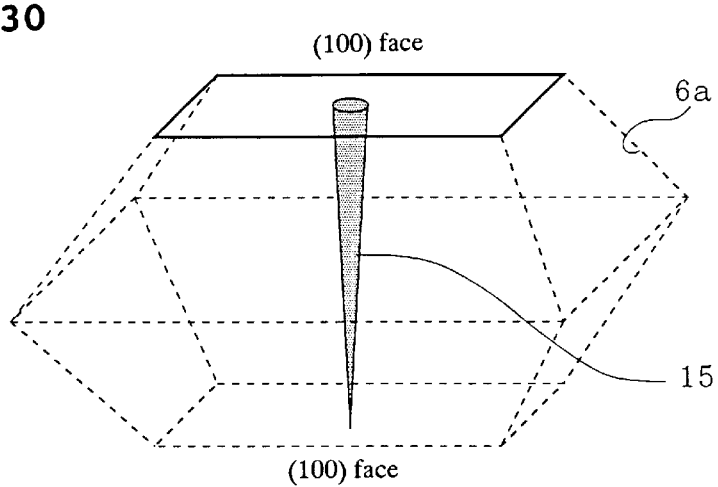
Figure 31:
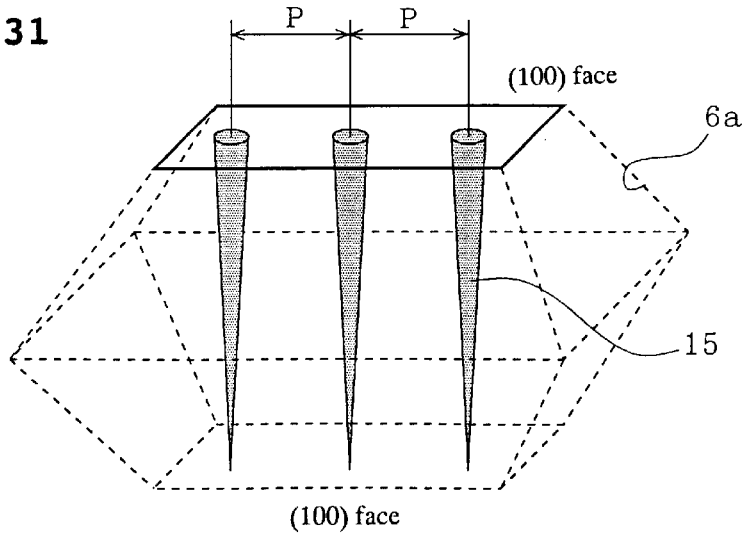

Although the above description has been made upon the case where continuous preholes are formed by laser light scanning and then anisotropic etching is performed to form a deep groove, it is theoretically possible to form such a deep groove if a prehole can be formed by a laser light in at least one place of opening portions formed by patterning (front and rear) of the oxide film. Of course, if a plurality of preholes can be formed in the pattern, it is conceivable that the etching time can be shortened because the area permitted to be etched at the same time increases correspondingly. FIG. 30 shows an example in which a prehole 15 is formed in one place. FIG. 31 shows an example in which preholes 15 are respectively formed in three places. In each case, a deep groove as shown in the drawing can be obtained by etching after each prehole is formed. Incidentally, in each of FIGS. 29 to 31, the silicon substrate 5 is a silicon wafer having a plane-orientation (100) face and the inner wall 6a of the groove has (111) faces.

Embodiment 13

Figure 32:
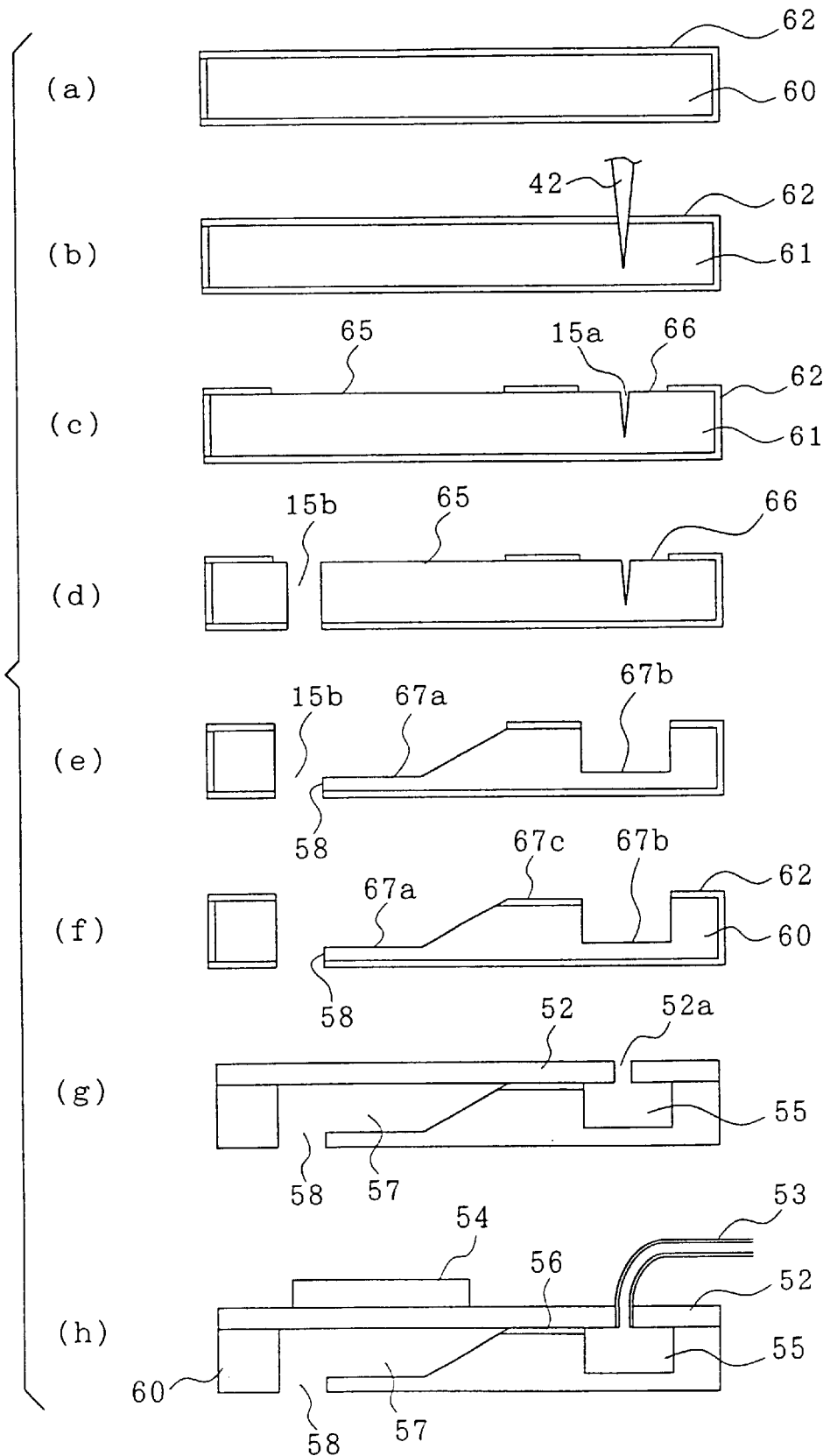
FIG. 32 is a process chart of an ink jet head produced by the application of a method for processing a work according to Embodiment 12 of the present invention.

A method for producing an ink jet head to which Embodiment 12 is applied will be described below. FIG. 32 is a process chart showing the processing steps for producing the ink jet head.

(a) For example, a silicon substrate 60 having a plane-orientation (110) face and having a thickness of 500 µm is prepared. A silicon oxide film 62 serving as an Si-etching resistant film is formed on the silicon substrate 60 by a thermal oxidation method so that the silicon oxide film 62 has a thickness of 1 µm. Of course, the silicon oxide film may be replaced by any suitable film such as a silicon nitride film or a metal film if the film can exhibit corrosion resistance to the Si etching solution.

(b) A portion serving as an ink chamber is irradiated with a laser light 42 while scanning to thereby form continuous preholes 15a. Assume now that the preholes 15a are continuous in a direction perpendicular to the paper surface of FIG. 32.

(c) Then, a resist is applied, by a spin coating method, onto the silicon substrate 60 on which the silicon oxide film 62 is formed. A resist film for forming an ink pressure chamber and an ink chamber is formed by use of a photolithographic technique. Then, the resist film is transferred onto the silicon oxide film by use of a buffer hydrofluoric acid solution. An unnecessary portion of the resist film is stripped by a stripper of a mixture solution containing sulfuric acid and a hydrogen peroxide aqueous solution. Thus, a pattern 65 corresponding to the ink pressure chamber and a pattern 66 corresponding to the ink chamber are formed by the silicon oxide film.

(d) Then, a hole 15b for forming an ink nozzle hole 58 is formed in a specific position of the pattern 65 corresponding to the ink pressure chamber. This perforating process is carried out, for example, by a method according to Embodiment 5, or the like.

(e) Further, wet crystal anisotropic etching is applied to the silicon substrate 60 in the condition that the silicon substrate 60 is immersed in an aqueous solution which contains 20% by weight of KOH and which is heated to 80° C. Thus, the silicon substrate 60 is etched by 300 µm to thereby form shapes 67a and 67b corresponding to the ink pressure chamber and the ink chamber, respectively, and an ink nozzle hole 58.

(f) Then, a mask pattern corresponding to an ink channel 56 formed between the ink chamber 55 and the ink pressure chamber 57 is formed on the silicon substrate 60 by use of a photolithographic technique. Further, a groove 67c corresponding to the ink channel 56 is formed by anisotropic etching. Then, all the silicon oxide film formed on the silicon substrate 60 is removed by immersion in a buffer hydrofluoric acid solution. Then, in order to improve the ink-wettability of the silicon substrate 60, a silicon oxide film 0.2 µm thick is formed on a surface of the silicon substrate 60 by a thermal oxidation process.

(g) A diaphragm 52 provided with an ink supply hole 52a formed in a position corresponding to the ink chamber 55 of the silicon substrate 60 in advance is stuck to the silicon substrate 60 by anodic jointing.

(h) Finally, a piezoelectric element 54 is bonded onto the glass diaphragm 52 in a position corresponding to the ink pressure chamber 57. Further, the silicon substrate 60 is cut into a desired shape by dicing and an ink supply pipe 53 is bonded to the hole formed in the glass diaphragm 52. Thus, an ink jet head as illustrated in the drawing is accomplished.

Embodiment 14

Figure 33:
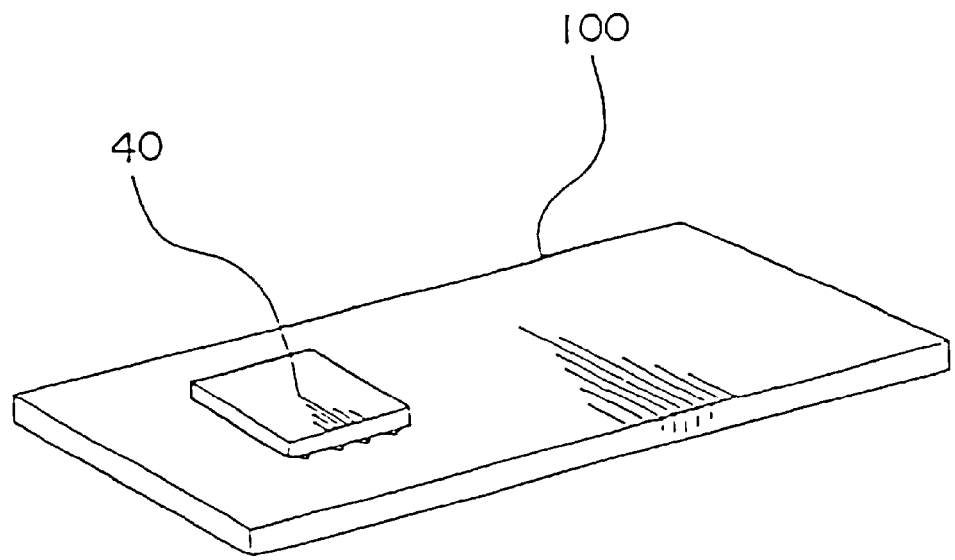
FIG. 33 is an explanatory diagram of a circuit substrate on which a semiconductor device according to any one of the aforementioned Embodiments is mounted.
Figure 34:
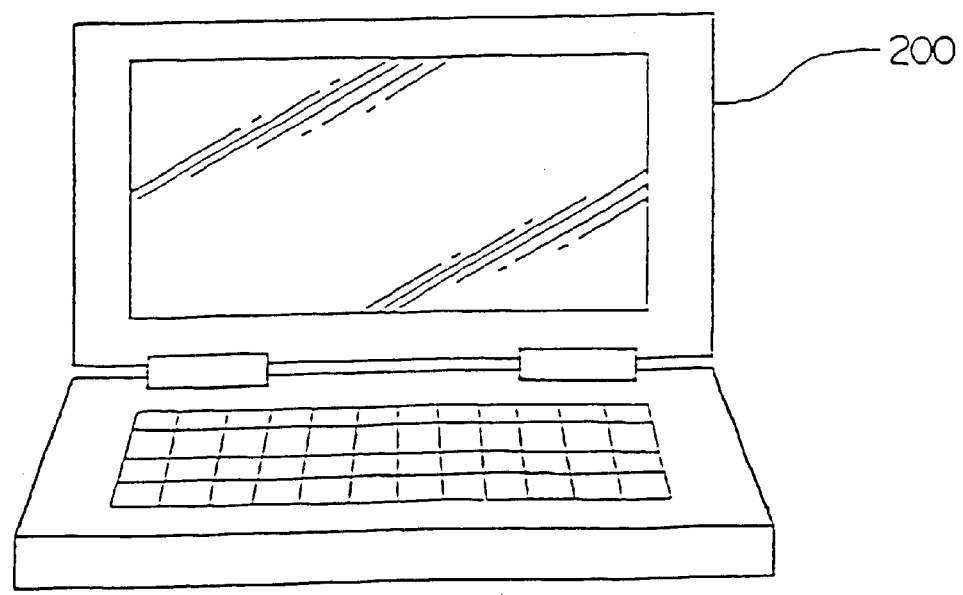
FIG. 34 is a perspective view of a notebook type personal computer in which the circuit substrate depicted in FIG. 33 is installed.
Figure 35:
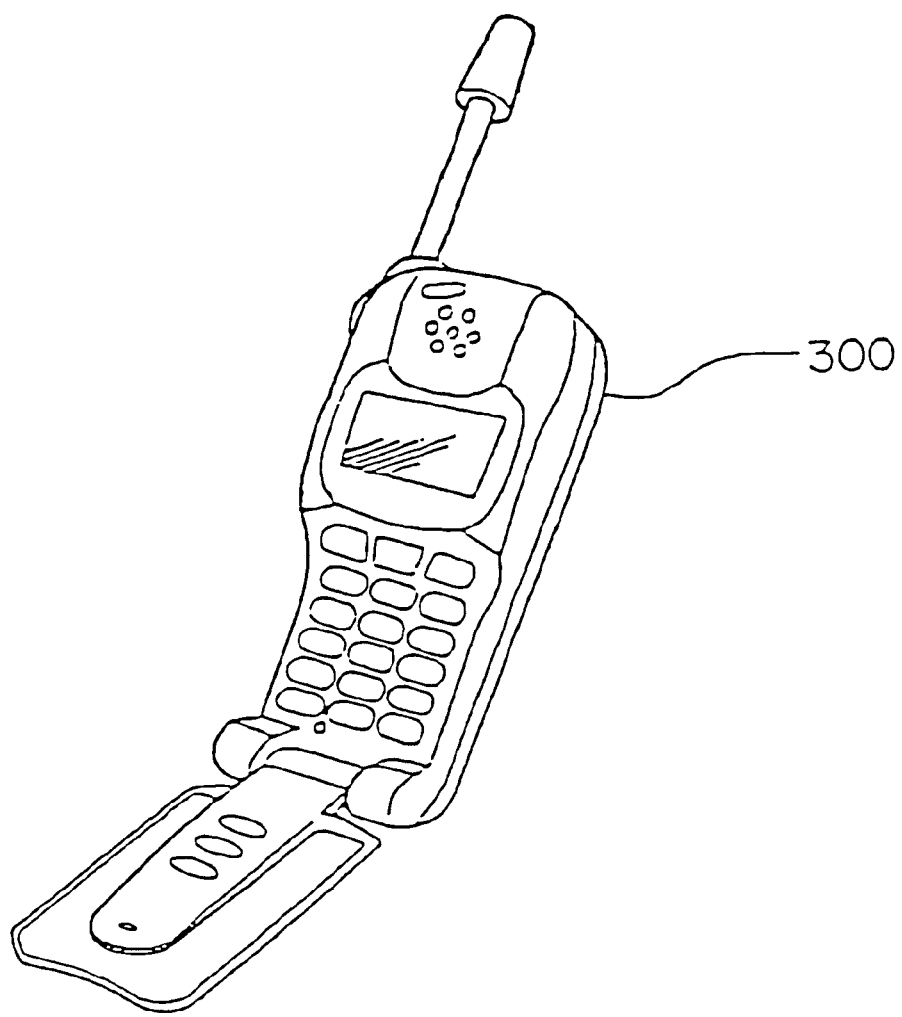
FIG. 35 is a perspective view of a portable telephone set in which the circuit substrate depicted in FIG. 33 is installed.

FIG. 33 is an explanatory diagram of a circuit substrate on which a semiconductor device according to any one of the aforementioned Embodiments (for example, in FIG. 3) is mounted. Generally, an organic substrate such as a glass epoxy resin substrate is used as the circuit substrate 100. Wiring patterns, for example, made of copper, or the like, are formed in the circuit substrate 100 so that the wiring patterns form a desired circuit. The wiring patterns are mechanically connected to external terminals of the semiconductor device 40 to attain electric connection therebetween. FIG. 34 and FIG. 35 show a notebook type personal computer 200 and a portable telephone set 300, respectively, as an electronic appliance using the circuit substrate 100.

Specific cases of the foregoing Embodiments will be described below as examples.

EXAMPLE 1

Figure 36:
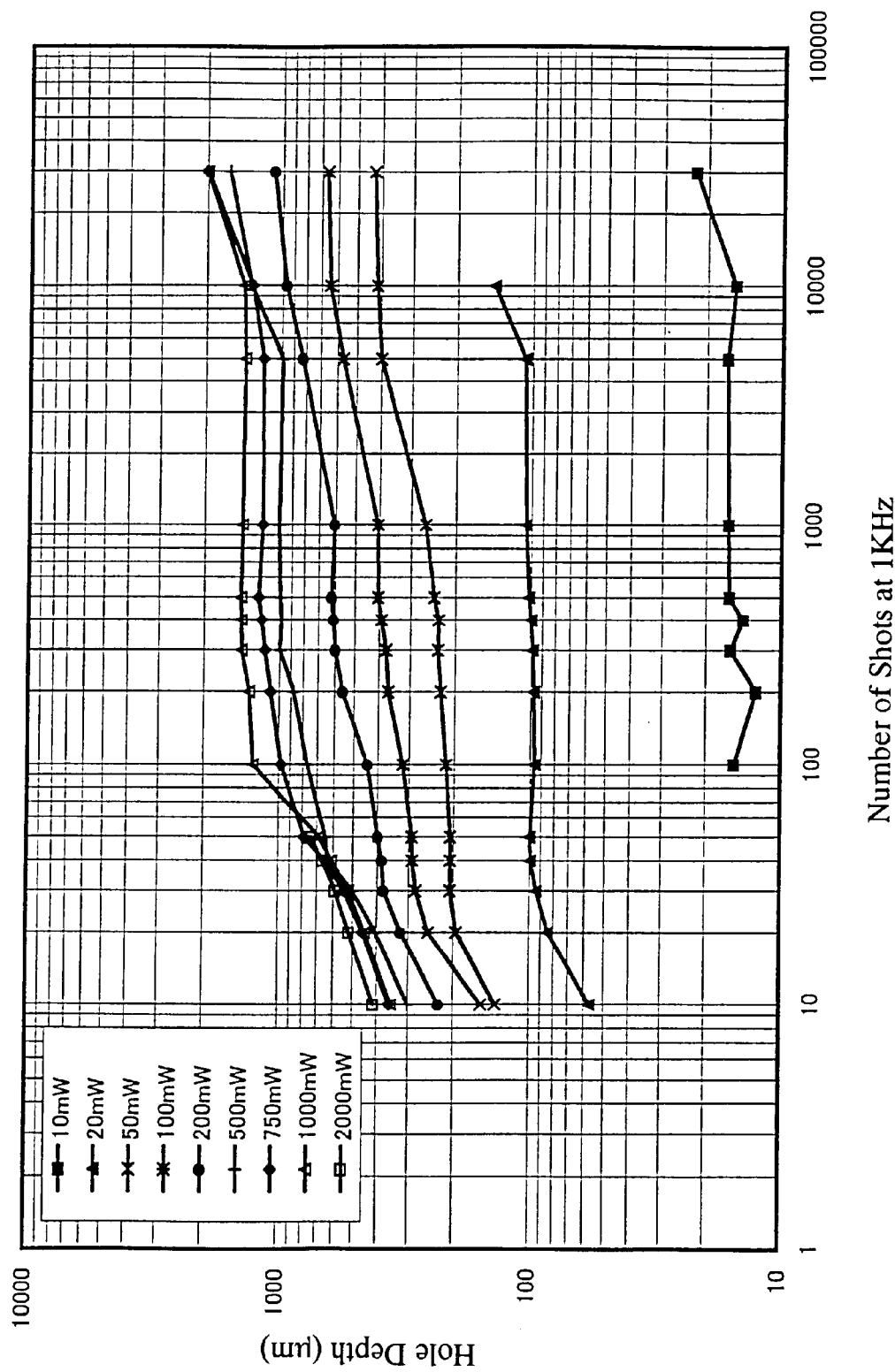
FIGS. 36 and 37 are characteristic diagrams showing the case where a prehole is formed by laser light radiation.
Figure 37:
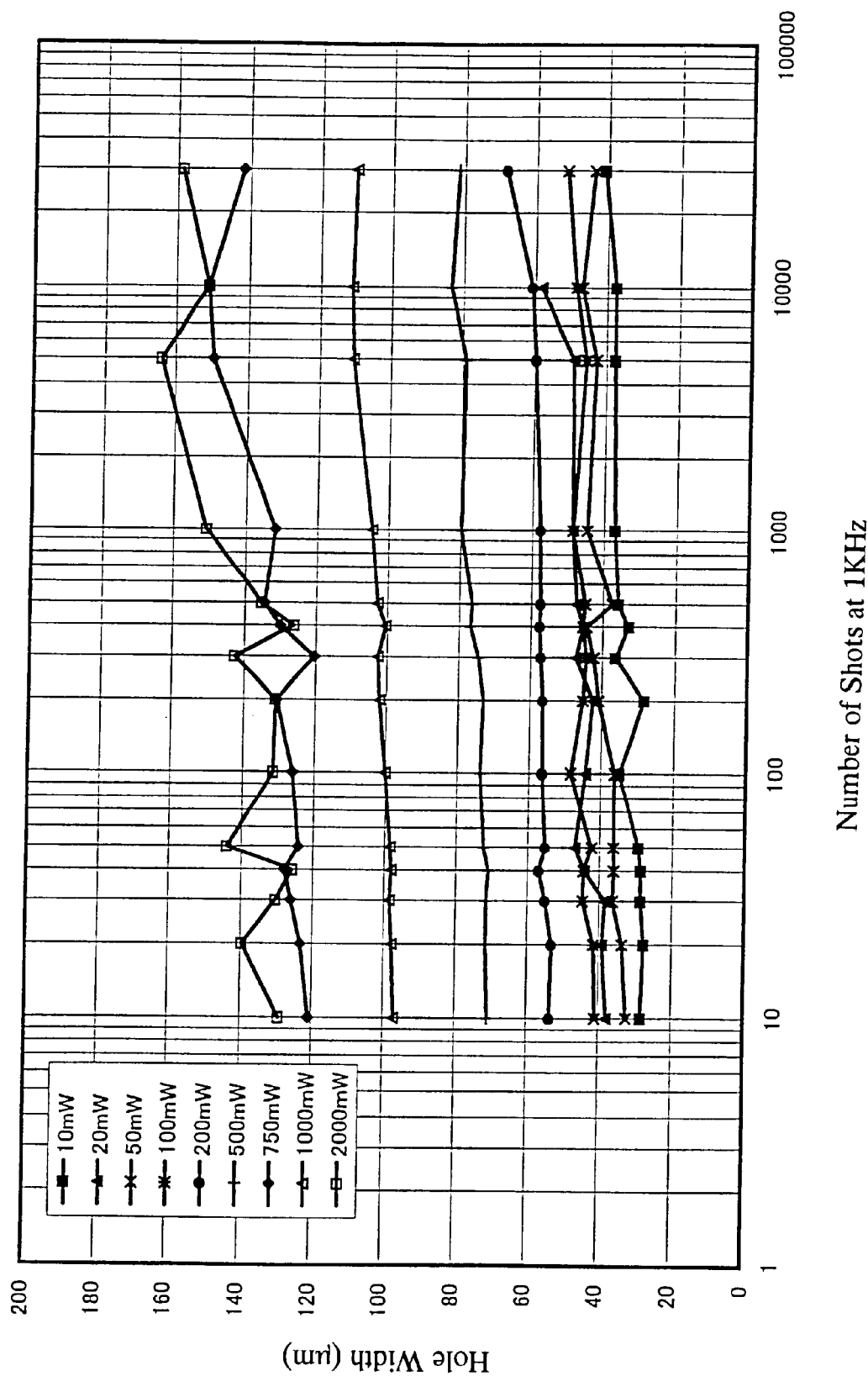

FIGS. 36 and 37 are characteristic diagrams for the case where a prehole is formed by laser light radiation. FIG. 36 shows the relationship between the number of laser shots at 1 KHz and the depth of the hole with laser power (10 mW to 2000 mW) as a parameter.

FIG. 37 shows the relationship between the number of laser shots at 1 KHz and the width of the hole with laser power (10 mW to 2000 mW) as a parameter. In each of FIGS. 36 and 37, it is apparent that a prehole with high aspect ratios are obtained. Incidentally, at this time, a second harmonic wave Q-switch YAG laser is used as the laser and a condensing lens f100 (focal length; 100 mm) is used as the optical system.

The conditions of performing etching in the case where the prehole is enlarged by anisotropic etching in this Example 1 are as follows:

<Etching Conditions>
  Etching Solution: KOH aqueous solution
  Concentration: 35% by weight
  Temperature of Chemicals: 80° C.
  Etching Time: 1 hour (A narrow hole appears when the etching time is short. All (111) faces appear when the etching time is long.)

<Wafer Conditions>
  Material: Si(100) (Crystalline silicon with a plane-orientation (100) face. This will be hereinafter referred to in the same manner.)
  Plate Thickness: 550 µm Incidentally, the KOH aqueous solution used as the etching solution may be replaced by an organic alkaline etching solution such as hydrazine, EPW (ethylenediamine-pyrocatechol-water), TMAH (tetramethylammonium hydroxide), etc.

EXAMPLE 2

Figure 38:
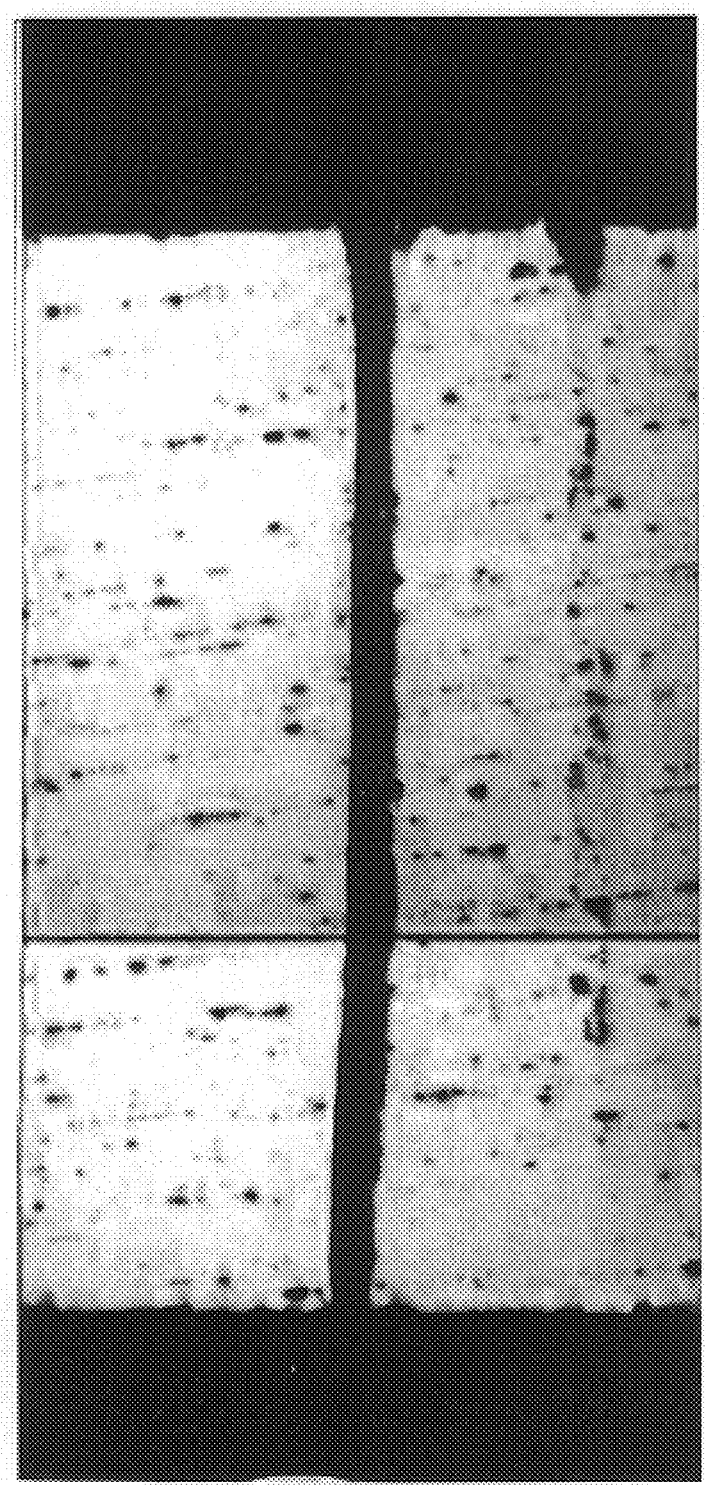
FIGS. 38A, 38B and 38C are enlarged views of a laser incidence plane, a laser exit plane and a hole side section (observed cut surface), respectively, in the case where a prehole is formed by laser light radiation in Embodiment 2.

FIGS. 38A, 38B and 38C are enlarged views of a laser incidence plane, a laser exit plane and a hole side section (observed cut surface), respectively, in the case where a prehole is formed by (circularly polarized) laser light radiation. The laser incidence plane and the laser exit plane in FIGS. 38A and 38B are both circular. Dross is produced in the periphery of the circles. On the other hand, the prehole in FIG. 38C is excellent in straightness (plate thickness: 550 µm). Incidentally, the numerical values shown in the respective lower portions of FIGS. 38A and 38B are as follows. For example, the numerical value "×2.00K" in FIG. 38A means a magnification of 2000. The numerical value "×200" in FIG. 41A as will be described later means a magnification of 200. The numerical value "15.0 µm" in FIG. 38A means the distance from the left end to the right end in dots written in proximity to the numerical value (in this example, the total distance of the dots is 15 µm). The same applies to other drawings which will be described later.

EXAMPLE 3

Figure 39:
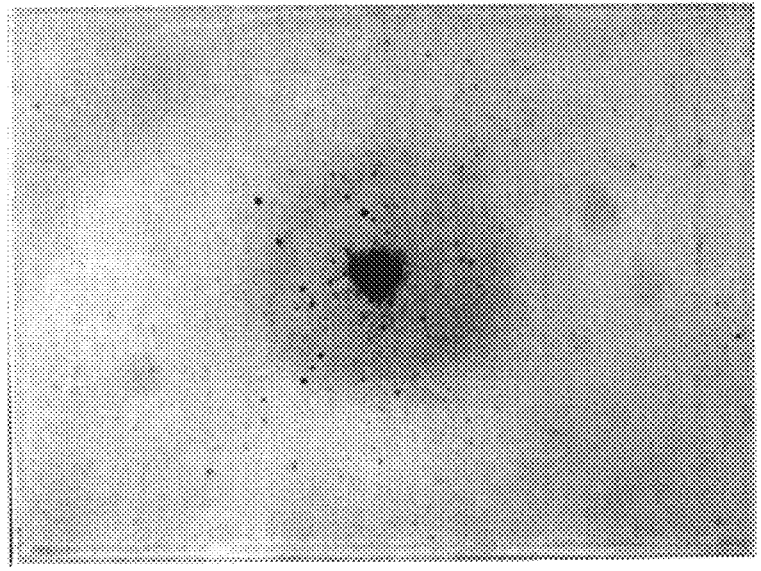
FIGS. 39A and 39B are views showing the states of dross before and after etching in the case where the dross is produced by laser light radiation in Embodiment 3.
Figure 39:
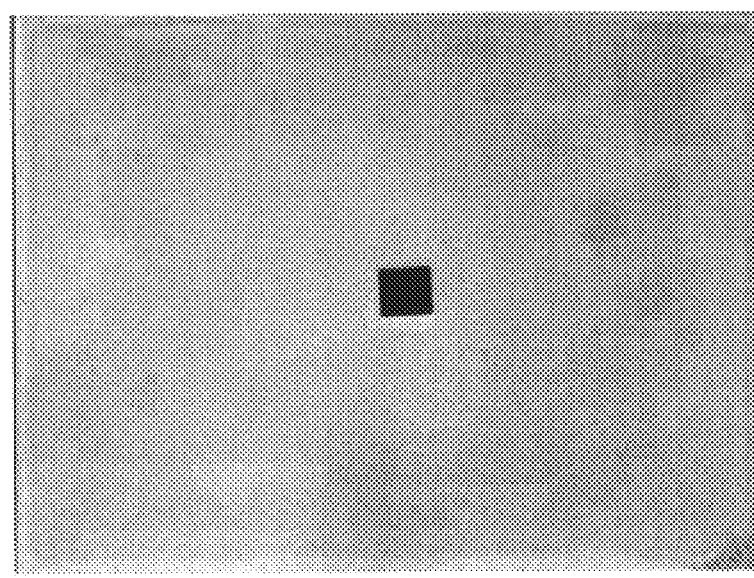

FIGS. 39A and 39B are views showing a state of dross before etching and a state of dross after etching in the case where the dross is produced when a prehole is formed by laser light radiation (FIGS. 39A and 39B correspond to the previously mentioned FIGS. 5(c) and 5(d), respectively). It is apparent that dross is removed after etching is performed.
<Laser Conditions>
  Laser Wavelength: 532 µm
  Condensing Lens: f100 mm
  Lamp Current: 28 A
<Processing Conditions>
  Oscillation Frequency: 1 kHz
  Power: 300 mW
  Number of Shots: 300 shots
  Direction of Linear Polarization: lateral direction in the drawings (magnetic field)
<Wafer Conditions>
  Material: Si(100)
  Plate Thickness: 550 µm
  Surface State: including an oxide film
<Etching Conditions>
  Etching Solution: KOH aqueous solution
  Concentration: 35% by weight
  Temperature: 80° C.
  Etching Time: 1 hour

EXAMPLE 4

Figure 40:
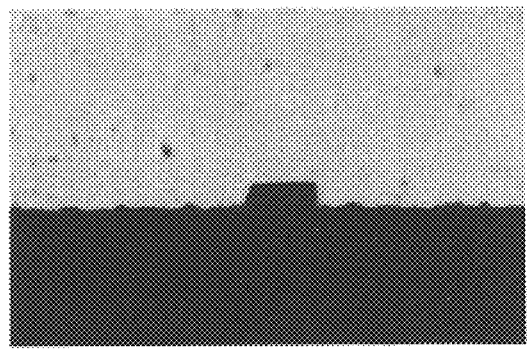
FIGS. 40A, 40B and 40C are views of an incidence plane (cut into halves), a section (observed cut surface) and an exit plane (cut into halves), respectively, showing states of the processed hole after etching in Embodiment 4.
Figure 40:
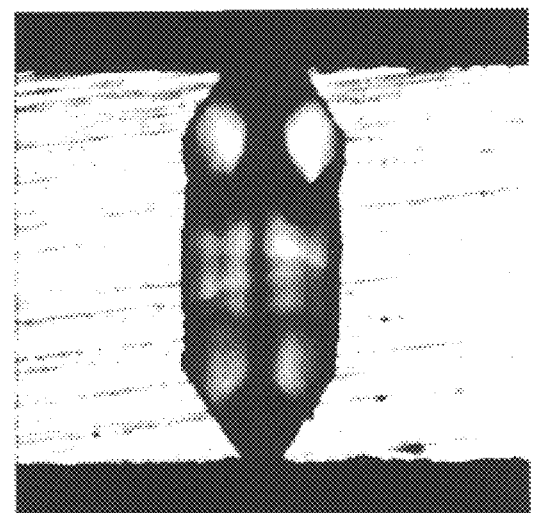
Figure 40:
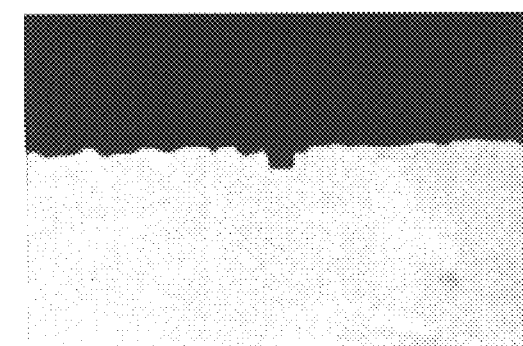

FIGS. 40A, 40B and 40C show an incidence plane (cut into halves), a section (observed cut surface) and an exit plane (cut into halves) respectively showing states of the processed hole after etching. Laser specifications, etc. in this case are as follows.
<Laser Conditions>
  Laser Wavelength: 532 µm
  Condensing Lens: f100 mm
  Lamp Current: 28 A
<Processing Conditions>
  Oscillation Frequency: 1 kHz
  Power: 300 mW
  Number of Shots: 300 shots
<Wafer Conditions>
  Material: Si(100)
  Plate Thickness: 550 µm
  Surface State: including an oxide film <Etching Conditions>
  Etching Solution: KOH aqueous solution
  Concentration: 35% by weight
  Temperature: 80° C.
  Etching Time: 1 hour

EXAMPLE 5

In this example, the relationship between the processing time required for etching and the shape of the prehole is examined. Laser specifications, etc. in this case are as follows.
<Laser Conditions>
  Laser Wavelength: 532 µm
  Condensing Lens: f100 mm
  Lamp Current: 28 A
<Processing Conditions>
  Oscillation Frequency: 1 kHz
  Number of Shots: 50, 500, 5000 shots
<Wafer Conditions>
  Material: Si(100)
  Plate Thickness: 550 µm
  Oxide Film: 1.5 µm
<Etching Conditions>
  Etching Solution: KOH aqueous solution
  Concentration: 35% by weight
  Temperature: 80° C.

Figure 41:
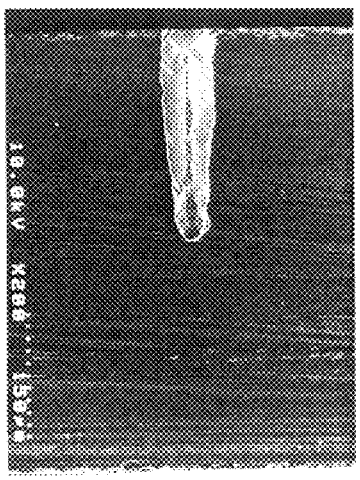
FIGS. 41A, 41B and 41C are views of sections (observed cut surfaces), respectively, showing the states of preholes in the case where etching is performed for 15 minutes in Embodiment 5.
Figure 41:
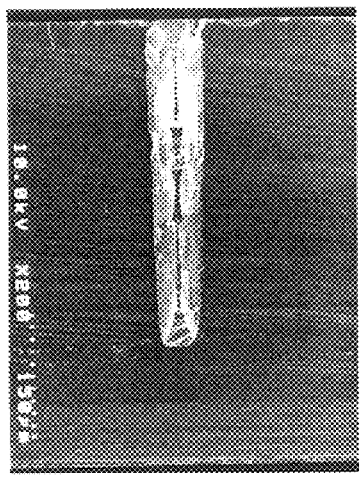
Figure 41:
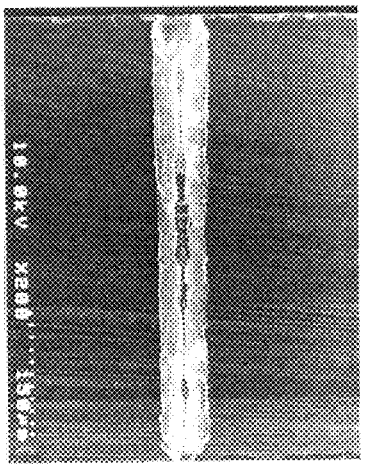

FIGS. 41A, 41B and 41C show sections (observed cut surfaces) respectively showing states of preholes (the number of laser shots: 50, 500, 5000) after etching is performed for 15 minutes.

Figure 42:
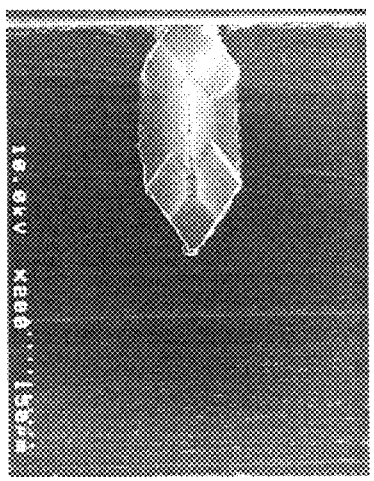
FIGS. 42A, 42B and 42C are views of sections (observed cut surfaces), respectively, showing the states of preholes in the case where etching is performed for 30 minutes in Embodiment 5.
Figure 42:
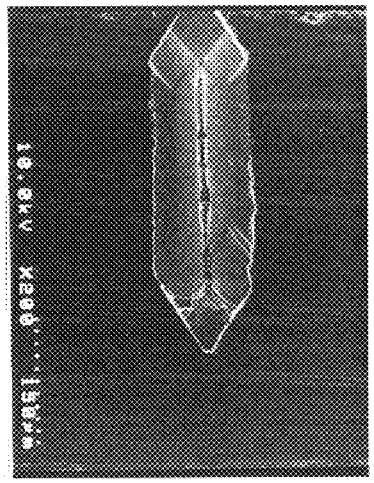
Figure 42:
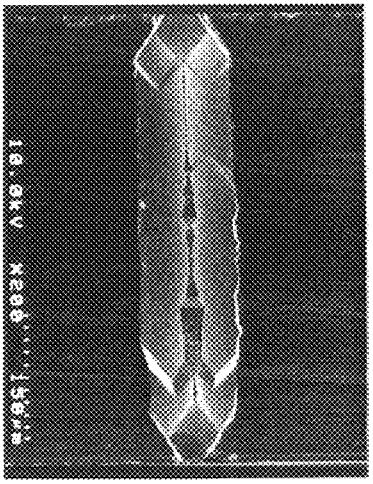

FIGS. 42A, 42B and 42C show sections (observed cut surfaces) respectively showing states of preholes (the number of laser shots: 50, 500, 5000) after etching is performed for 30 minutes.

Figure 43:
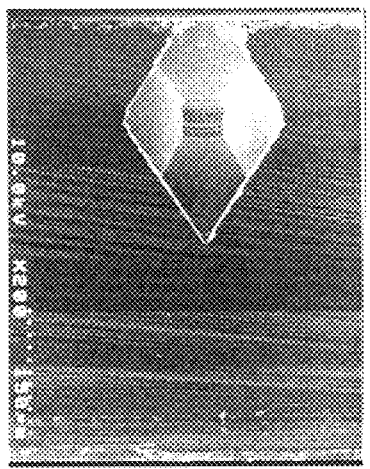
FIGS. 43A, 43B and 43C are views of sections (observed cut surfaces), respectively, showing the states of preholes in the case where etching is performed for 60 minutes in Embodiment 5.
Figure 43:
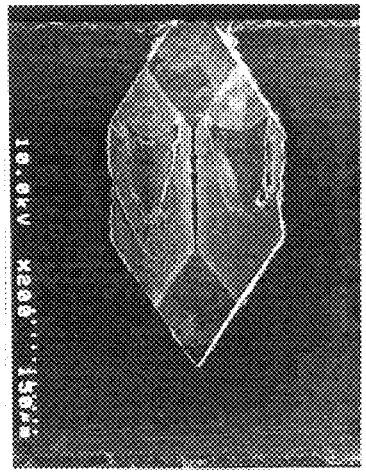
Figure 43:
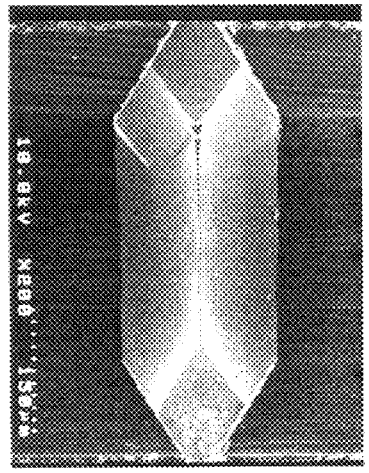

FIGS. 43A, 43B and 43C show sections (observed cut surfaces) respectively showing states of preholes (the number of laser shots: 50, 500, 5000) after etching is performed for 60 minutes.

Figure 44:
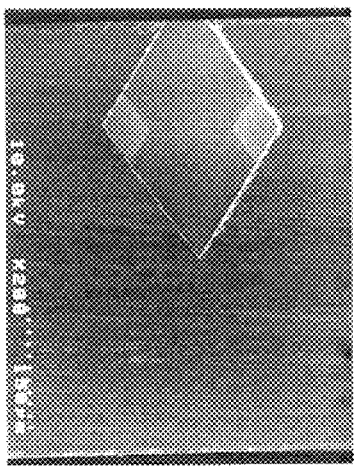
FIGS. 44A, 44B and 44C are views of sections (observed cut surfaces), respectively, showing the states of preholes in the case where etching is performed for 90 minutes in Embodiment 5.
Figure 44:
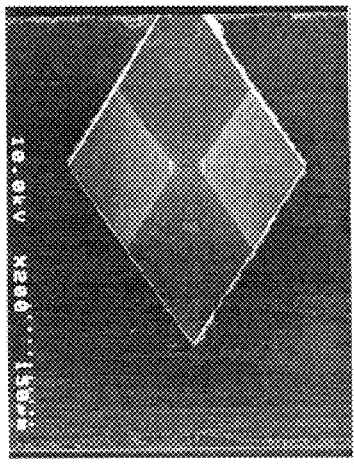
Figure 44:
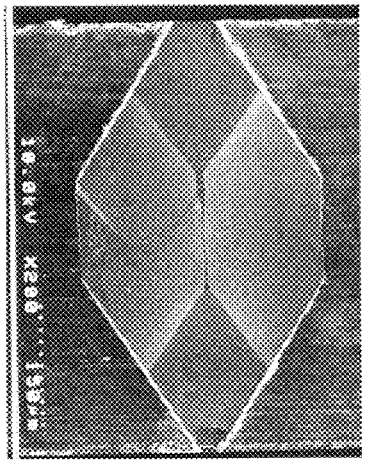

FIGS. 44A, 44B and 44C show sections (observed cut surfaces) respectively showing states of preholes (the number of laser shots: 50, 500, 5000) after etching is performed for 90 minutes.

Figure 45:
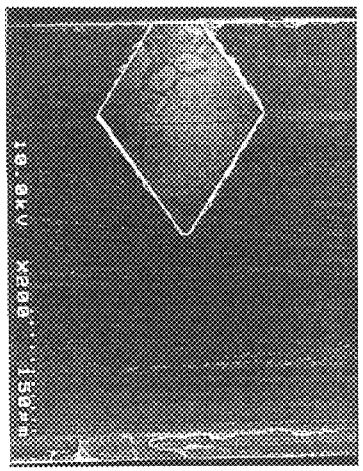
FIGS. 45A, 45B and 45C are views of sections (observed cut surfaces), respectively, showing the states of preholes in the case where etching is performed for 120 minutes in Embodiment 5.
Figure 45:
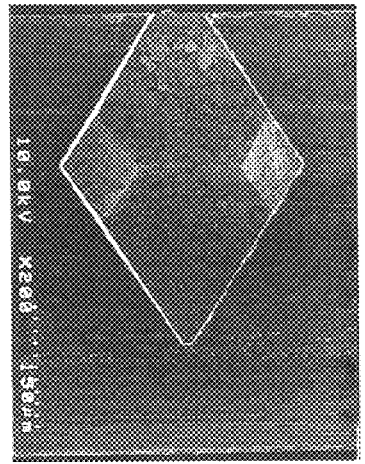
Figure 45:
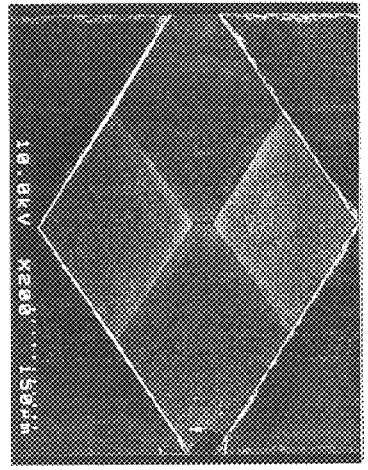

FIGS. 45A, 45B and 45C show sections (observed cut surfaces) respectively showing states of preholes (the number of laser shots: 50, 500, 5000) after etching is performed for 120 minutes.

Figure 46:
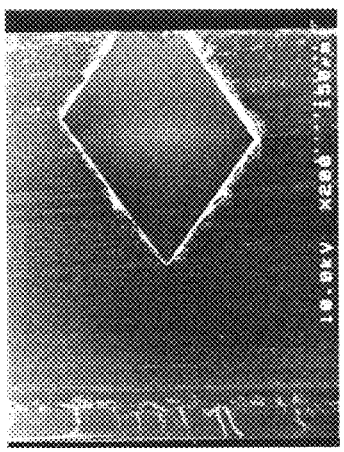
FIGS. 46A, 46B and 46C are views of sections (observed cut surfaces), respectively, showing the states of preholes in the case where etching is performed for 240 minutes in Embodiment 5.
Figure 46:
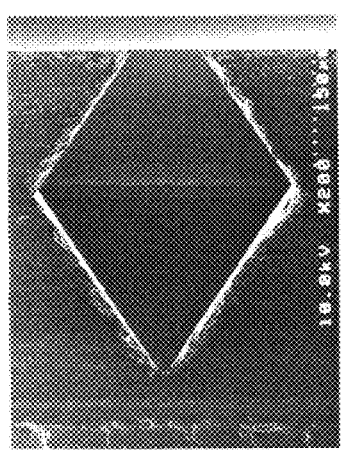
Figure 46:
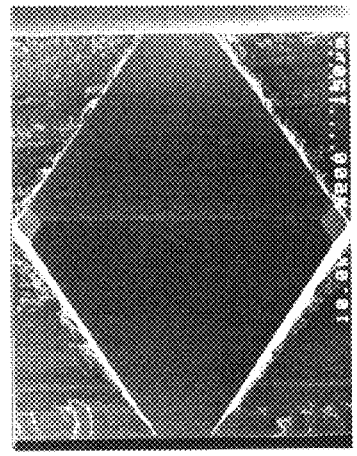

FIGS. 46A, 46B and 46C show sections (observed cut surfaces) respectively showing states of preholes (the number of laser shots: 50, 500, 5000) after etching is performed for 240 minutes.

As is obvious from the aforementioned drawings, it is apparent that the shape of the prehole can be controlled by controlling the etching time.

EXAMPLE 6

FIGS. 47A and 47B show sections (observed cut surfaces) in the case where, after an oxide film is formed on a silicon substrate with a plane-orientation (110) face, the silicon substrate is irradiated with a laser light and then subjected to etching. FIG. 47A shows the case where etching is applied to a hole in the condition that a laser light has not yet pierced the substrate. FIG. 47B shows the case where etching is applied to a hole in the condition that a laser light has already pierced the substrate. In each case, plane-orientation (111) faces appear so that a perpendicular hole can be obtained.

EXAMPLE 7

Figure 48:
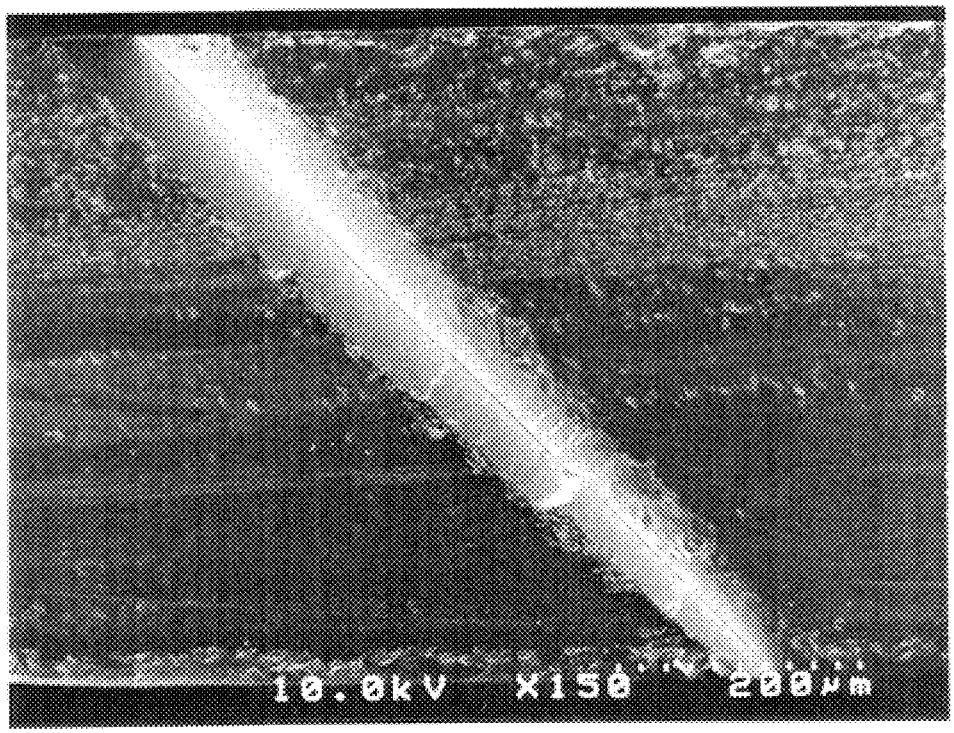
FIGS. 48 and 49 are views showing sections (observed cut surfaces) of a through-hole and a blind hole (non-through-hole), respectively, in the case where, after an oxide film is formed on a silicon substrate having a plane-orientation (100) face, the substrate is irradiated with a laser light obliquely at 45 degrees and then etched.
Figure 49:
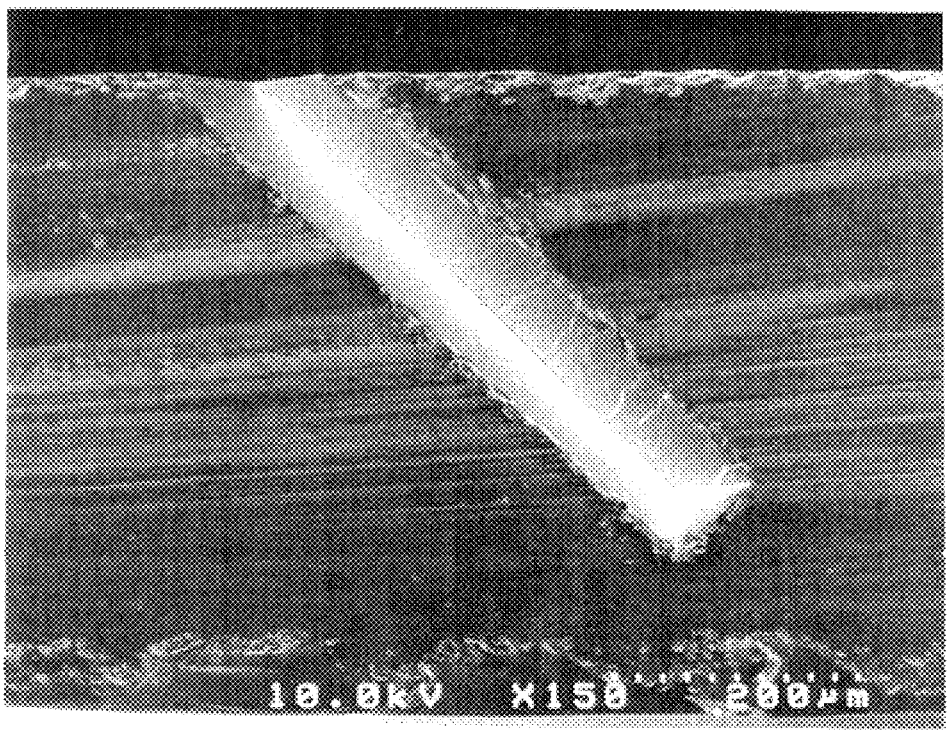

FIGS. 48 and 49 show sections (observed cut surfaces) of a through-hole 60 and a blind hole (non-through-hole) 61 corresponding to FIG. 22A or 22B.

EXAMPLE 8

Figure 50:
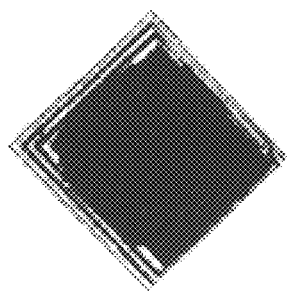
FIGS. 50A and 50B are plan views of a state that a silicon substrate is subjected to laser light radiation and anisotropic etching, and a state that the silicon substrate is subjected to ultrasonic cleaning after that, respectively.
Figure 50:
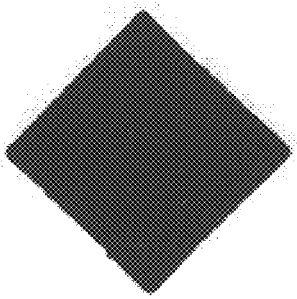

FIGS. 50A and 50B are plan views showing states before and after ultrasonic cleaning in the case where a through-hole is formed in a silicon substrate by laser light radiation and anisotropic etching. FIG. 50A shows a state before ultrasonic cleaning. FIG. 50B shows a state after ultrasonic cleaning. It is apparent that a fluted silicon oxide film formed in the periphery of the through-hole is removed by performing the ultrasonic cleaning.

Laser specifications, etc. in this case are as follows.

<Laser Conditions>

Laser Wavelength: 532 μm
Condensing Lens: f100 mm
Lamp Current: 28 A

<Processing Conditions>

Oscillation Frequency: 1 kHz
Polarization: Linear Polarization

<Wafer Conditions>

Material; Si(100)
Plate Thickness: 550 μm
Oxide Film: 1.5 μm

<Etching Conditions>

Etching Solution: KOH aqueous solution
Concentration: 35% by weight
Temperature: 80° C.
Etching Time: 3 hours

EXAMPLE 9

Figure 51:
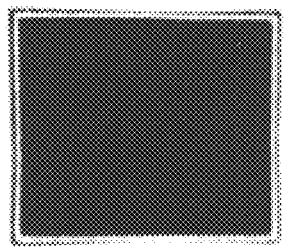
FIG. 51 is a plan view of a processed state in the case where the processing time required for anisotropic etching is set to be long.

FIG. 51 is a plan view showing a state of backing-up of the oxide film owing to long-term etching in the case where a through-hole is formed in a silicon substrate by laser light radiation and anisotropic etching. Although FIG. 51 shows a state in which the fluted silicon oxide film is removed because of regression of the silicon oxide film owing to long-term etching, the state before removal of the fluted portion of the silicon oxide film is the same as that shown in FIG. 50A. Laser specifications, etc. in this case are the same as those in Example 8 except that the etching time is 4 hours.

EXAMPLE 10

Figure 52:
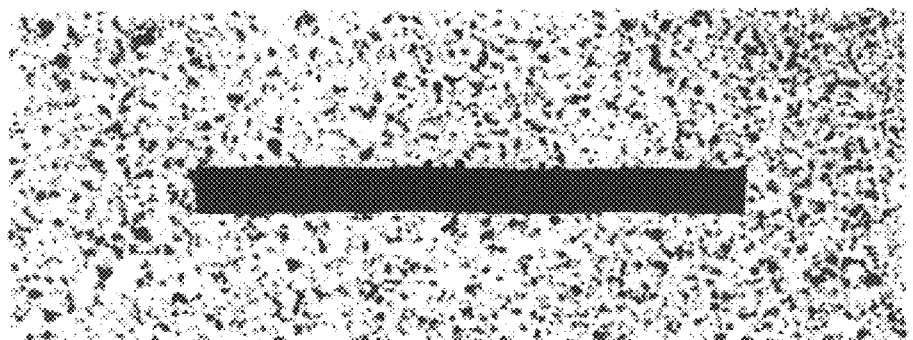
FIGS. 52A to 52E are views showing the results of groove processing.
Figure 52:
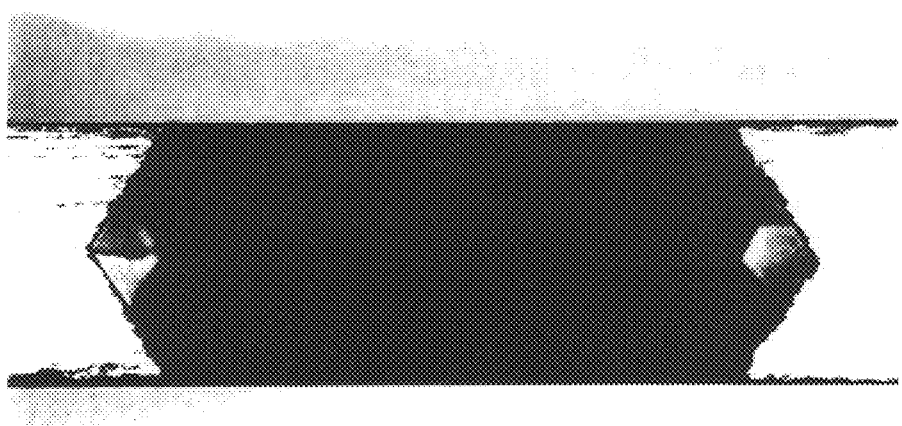
Figure 52:
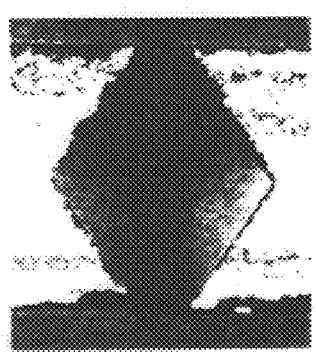
Figure 52:
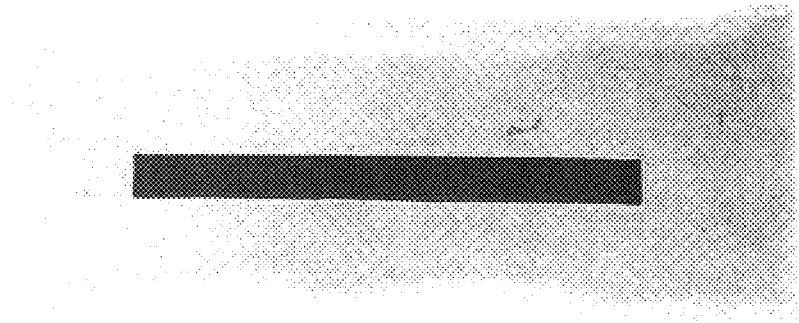
Figure 52:
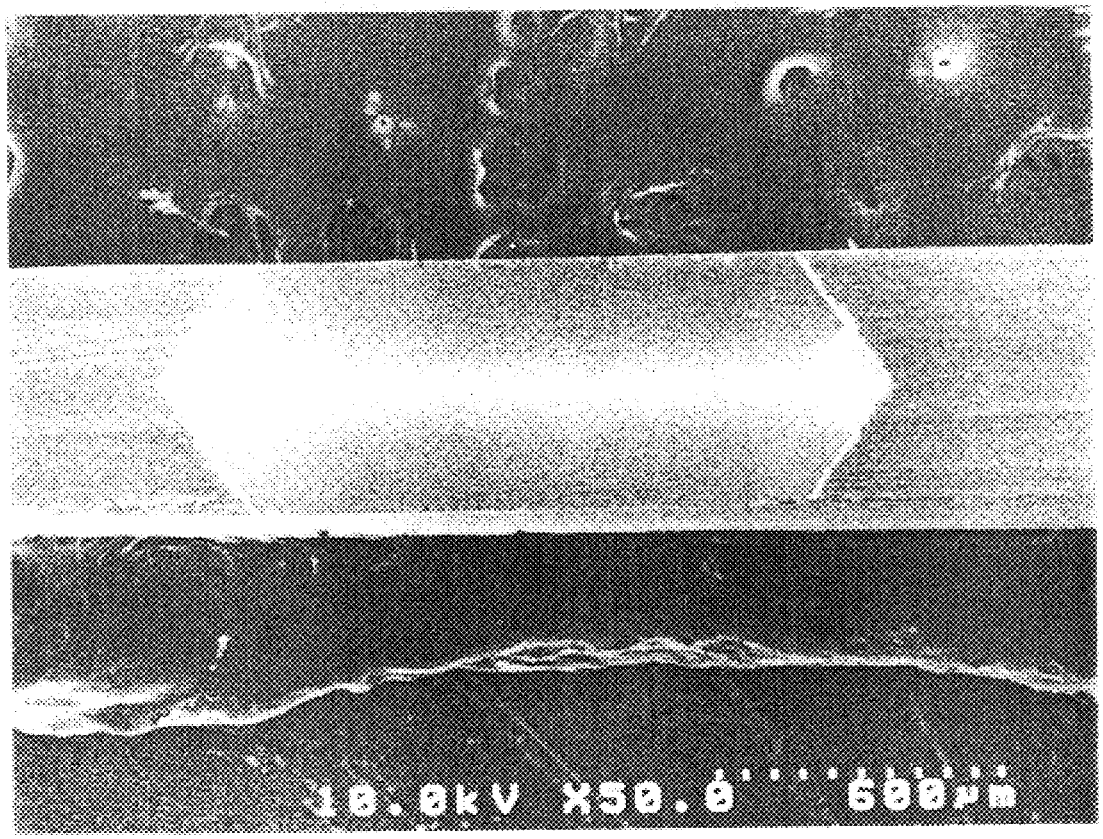

FIGS. 52A to 52E are views showing experimental results of processing of a pregroove by use of an YAG laser. FIG. 52A shows an incidence plane (direction ① in FIG. 29). FIG. 52B shows a section (a direction of length, direction ② in FIG. 29). FIG. 52C shows a side cut surface (direction ③ in FIG. 29). FIG. 52D shows an exit plane (direction ④ in FIG. 29). FIG. 52E shows a section (a direction of length, direction ⑤ in FIG. 29). Laser specifications, etc. in this case are as follows.

<Laser Conditions>

Laser Wavelength: 532 μm
Condensing Lens: f100 mm
Lamp Current: 28 A

<Processing Conditions>

Oscillation Frequency: 1 kHz
Power: 400 mW
Number of Shots: scanning for several seconds
Polarization: Linear Polarization
Processed Surface: one surface <Wafer Conditions>

Material: Si(100)
Plate Thickness: 550 μm
Oxide Film: 1.5 μm

<Etching Conditions>

Etching Solution: KOH aqueous solution
Concentration: 35% by weight
Temperature:. 80° C.
Etching Time: 3 hours

What is claimed is:

1. A method of producing a semiconductor chip, comprising the steps of:

forming a prehole in a crystalline substrate by irradiation of a laser beam split by a phase grating;

enlarging said prehole by anisotropic etching to thereby form a through-hole;

forming an electrically insulating film on an inner wall of said through-hole; and forming an electrically conducting material in said through-hole having said electrically insulated inner wall to thereby form a metal bump for electrically connecting one surface of said crystalline substrate to the other surface of said crystalline substrate.

2. A method of producing a semiconductor chip, comprising the steps of:

forming a prehole in a crystalline substrate by laser irradiation of a laser beam circularly polarized or randomly polarized;

enlarging said prehole by anisotropic etching to thereby form a through-hole;

forming an electrically insulating film on an inner wall of said through-hole; and forming an electrically conducting material in said through-hole having said electrically insulated inner wall to thereby form a metal bump for electrically connecting one surface of said crystalline substrate to the other surface of said crystalline substrate.

3. A method of producing a semiconductor chip according to claim 1, wherein said prehole is formed by laser beam irradiation at a portion of an electrode pad formed on said crystalline substrate, and said electrode pad and said metal bump are electrically connected to each other.

4. A method of producing a semiconductor chip according to claim 3, wherein protective films are formed on one and the other surfaces of said crystalline substrate respectively so that said crystalline substrate is irradiated with the laser beam through said protective films.

5. A method of producing a semiconductor chip according to claim 4, wherein said crystalline substrate is irradiated with the laser beam from a surface of said crystalline substrate on which said electrode pad is formed.

6. A method of producing a semiconductor chip according to claim 4, wherein said crystalline substrate is irradiated with the laser beam from a surface of said crystalline substrate which is opposite to said surface on which said electrode pad is formed.

7. A method of producing a semiconductor chip according to claim 4, wherein said crystalline substrate is irradiated with the laser beam from a surface of said crystalline substrate on which said electrode pad is formed, and from a surface of said crystalline substrate which is opposite to said surface on which said electrode pad is formed.

8. A method of producing a semiconductor chip according to claim 4, wherein said electrode pad covered with the protective film has an opening portion in its center portion so that said laser beam is made to pass through said opening portion across said protective film.

9. A method of producing a semiconductor chip according to claim 8, wherein a patterned protective film is formed between said electrode pad and a surface of said crystalline substrate so that the etching form by said anisotropic etching is defined by the shape of said patterned protective film.

10. A method of producing a semiconductor chip according to claim 3, wherein said crystalline substrate is a silicon substrate.

11. A method of producing a semiconductor chip according to claim 10, wherein said silicon substrate is surface-oriented to a (100) face.

12. A method of producing a semiconductor chip according to claim 10, wherein said silicon substrate is surface-oriented to a (110) face.

13. A method of producing a semiconductor chip according to claim 4, wherein a fluted portion of said protective film formed so as to cover a periphery of said through-hole is removed by ultrasonic cleaning.

14. A method of producing a semiconductor chip according to claim 4, wherein a fluted portion of said protective film formed so as to cover a periphery of said through-hole is removed on the basis of adjustment of processing time required for said anisotropic etching.

15. A method of producing a semiconductor device, comprising the step of:

laminating semiconductor chips on one another, each of said semiconductor chips being produced by said method according to claim 3.

16. A method of producing a circuit substrate, comprising the step of:

incorporating a semiconductor device therein, said semiconductor device being produced by said method according to claim 15.

17. A method of producing a semiconductor chip according to claim 1, wherein said prehole is formed by laser beam irradiation at a portion of an electrode pad formed on said crystalline substrate, and said electrode pad and said metal bump are electrically connected to each other.

* * * * *